United States Patent [19]
Kusunoki et al.

[11] Patent Number: 5,554,876
[45] Date of Patent: *Sep. 10, 1996

[54] FIELD EFFECT TRANSISTOR INCLUDING SILICON OXIDE FILM AND NITRIDED OXIDE FILM AS GATE INSULATOR FILM AND MANUFACTURING METHOD THEREOF

[75] Inventors: Shigeru Kusunoki; Masahide Inuishi, both of Hyogo-ken, Japan

[73] Assignee: Mitsubishi Denki Kabushiki Kaisha, Tokyo, Japan

[ * ] Notice: The term of this patent shall not extend beyond the expiration date of Pat. No. 5,369,297.

[21] Appl. No.: 292,591

[22] Filed: Aug. 16, 1994

Related U.S. Application Data

[63] Continuation of Ser. No. 930,932, Aug. 18, 1992, Pat. No. 5,369,297.

[30]  Foreign Application Priority Data

Sep. 5, 1991 [JP] Japan .................................. 3-225686
Dec. 6, 1991 [JP] Japan .................................. 3-323239
Jul. 3, 1992 [JP] Japan .................................. 4-176873

[51] Int. Cl.$^6$ ................................................. H01L 29/78
[52] U.S. Cl. .......................... 257/411; 257/344; 257/346; 257/371; 257/408; 257/900
[58] Field of Search .................................... 257/411, 344, 257/346, 408, 371, 900

[56]  References Cited

U.S. PATENT DOCUMENTS

| | | | |
|---|---|---|---|
| 4,623,912 | 11/1986 | Change et al. | 257/411 |
| 5,034,798 | 7/1991 | Ohsima | 257/411 |
| 5,132,758 | 7/1992 | Minami et al. | 257/900 |
| 5,182,619 | 1/1993 | Pfiester | 257/900 |
| 5,324,974 | 6/1994 | Liao | 257/900 |
| 5,369,297 | 11/1994 | Kusunoki et al. | 257/411 |

FOREIGN PATENT DOCUMENTS 62-173763  7/1987  Japan .

OTHER PUBLICATIONS

Takashi Hori, "Demands for Submicron MOSFET's and Nitrided Oxide Gate–Dielectrics" Extended Abstracts of the 21st Conference on Solid State Devices and Materials, Tokyo 1989, pp. 197–200.

Hisayo S. Momose et al, "Hot Carrier Related Phenomena for N– and P–Mosfets with Nitrided Gate Oxide by RTP", IEDM 1989, pp. 167–170.

Eiji Takeda et al, "An As–P(N+–N–) Double Diffused Drain Mosfet For VLSIS" 1982 symposium on VLSIS Technology Digest, pp. 40–41.

Pieter Balk, "The Si–SiO2 System", Materials Science Monographs, 32, 1988.

S. Kusunoki et al, "Hot–Carrier–Resistant Structure by Re–Oxidized Nitrided Oxide Sidewall for Highly Reliable and High Performance LDD MOSFETS", IEDA 91, pp. 1–4.

T. Mizuno et al, "High Dielectric LDD Spacer Technology for High Performance MOSFET Using Gate–Fringing Field effecs" IEDM 89, pp. 613–616.

T. Hori et al "Ultra–Thin Re–Oxidized Nitrided–Oxides Prepared by Rapid thermal Processing" IEDM 87, pp. 570–573.

Primary Examiner—Gene M. Munson
Attorney, Agent, or Firm—Lowe, Price, LeBlanc & Becker

[57]  ABSTRACT

An N type field effect transistor having a higher resistivity to hot carriers and exhibiting a higher current handling capability even when used at a low gate voltage, and a method of manufacturing such a transistor are provided. A nitrided oxide film is formed on a drain avalanche hot carrier injection region. The nitrided oxide film is highly resistive to drain avalanche hot carriers as compared to a silicon oxide film. The silicon oxide film is formed on a channel hot electron injection region. The silicon oxide film is highly resistive to channel hot electrons as compared to the nitrided oxide film. A major portion of a gate insulator film is a silicon oxide film. The silicon oxide film exhibits a higher current handling capability at a low gate voltage as compared to the nitrided oxide film.

7 Claims, 39 Drawing Sheets

FIELD EFFECT TRANSISTOR INCLUDING SILICON OXIDE FILM AND NITRIDED OXIDE FILM AS GATE INSULATOR FILM AND MANUFACTURING METHOD THEREOF

This application is a continuation of application Ser. No. 07/930,932 filed Aug. 18, 1992 now U.S. Pat. No. 5,369,297.

BACKGROUND OF THE INVENTION

1. Field of the Invention

The present invention relates generally to field effect transistors and, more particularly, to a field effect transistor including a silicon oxide film and a nitrided oxide film as a gate insulator film, and a method of manufacturing such a field effect transistor.

2. Description of the Background Art

A nitrided oxide film formed by a rapid lamp annealing is a highly reliable insulator film to dielectric breakdown. This is disclosed in, for example, "Extended Abstract of the 21st Conference on Solid State Devices and Materials", Tokyo, p.197.

The nitrided oxide film is such a film that a large amount of nitrogen is included in an interface between the nitrided oxide film and a material beneath the nitrided oxide film. With a reduction in scale of devices, it is considered that such a nitrided oxide film is employed as a gate insulator film of a MOS (Metal Oxide Semiconductor) field effect transistor.

FIG. 71 is a schematic cross-sectional view of a MOS field effect transistor with a conventional single drain structure. Such a MOS field effect transistor is disclosed in, for example, Digest "International Electron Device Meeting 1989", p. 267. A source region 3a and a drain region 3b are formed with a spacing in a silicon substrate 1 having a main surface 2. A nitrided oxide film 5 is formed on main surface 2 between source region 3a and drain region 3b. A gate electrode 7 is formed on nitrided oxide film 5.

A description will now be made on a method of manufacturing such a MOS field effect transistor. First, silicon substrate 1 with a boron concentration of approximately $1 \times 10^{17}/cm^2$ is prepared. A silicon oxide film of 70 Å is formed on main surface 2 of silicon substrate 1. This silicon oxide film is then nitrided by lamp annealing in an atmosphere including ammonium. The nitridation is carried out at a temperature of 900° C.–1100° C. for 10–60 seconds. After the end of nitridation, the silicon oxide film is re-oxidized in an oxygen atmosphere. The re-oxidation is carried out at a temperature of 1000° C.–1100° C. for 10–300 seconds. Thus, nitrided oxide film 5 is formed.

Then, polycrystalline silicon of 2000–4000 Å in thickness is formed on nitrided oxide film 5. The polycrystalline silicon film and nitrided oxide film 5 are then patterned by employing photolithography and etching technique, to form gate electrode 7. Silicon substrate 1 is then implanted with arsenic ions with gate electrode 7 used as a mask. Acceleration energy is 30–70 kev and a dose is $1 \times 10^{15}/cm^2$ or more. After that, a resulting film is annealed to form source region 3a and drain region 3b. The steps of manufacturing the MOS field effect transistor is over through the foregoing processings.

The concentration of nitrogen in nitrided oxide film 5 depends on a nitriding atmosphere, nitridation temperature, nitridation time, re-oxidation time, an initial thickness of silicon oxide film and the like. That is, when a nitriding atmosphere is $N_2O$, nitrogen concentration is lower as compared to the case with an ammonium gas even though the same parameters are employed for other parameters. As re-oxidation time becomes longer, nitrogen concentration becomes lower. Nitrogen concentration becomes higher with a higher nitridation temperature, a longer nitridation time, a smaller initial thickness of silicon oxide film and a higher ammonium concentration.

There are two types of hot carriers that cause a deterioration in characteristics of MOS field effect transistors: drain avalanche hot carriers and channel hot holes (electrons). A channel hot hole (electron) phenomenon indicates a case where holes (electrons) traveling in a channel region 11 are accelerated by an electric field around drain 3b and then enter in a gate insulator film 6 near drain 3b as shown in FIG. 72. Silicon substrate, source region and gate electrode are denoted with reference characters 1, 3a and 7, respectively. The channel hot holes (electrons) are also called channel hot carriers. In a case with an NMOS transistor, channel hot carriers are channel hot electrons, while in a case with a PMOS transistor, channel hot carriers are channel hot holes.

A description will now be given on drain avalanche hot carriers with reference to FIG. 73. When accelerated carriers collide with lattice of Si, electron-hole pairs are generated. At that time, holes (electrons) are drawn by a gate voltage and enter into gate insulator film 6. It depends on the type of a MOS transistor whether electrons or holes enter into gate insulator film 6. Electrons enter in the case of an NMOS transistor, while holes enter in the case of a PMOS transistor.

Both the channel hot holes (electrons) and the drain avalanche hot carriers are generated near the drain. However, it appears that the channel hot holes (electrons) are generated closer to the source than the drain avalanche hot carriers. If a comparison is made between a gate voltage provided when channel hot holes (electrons) are generated and that provided when drain avalanche hot carriers are generated, the gate voltage provided with generation of the channel hot holes (electrons) is higher. As the gate voltage becomes higher, the holes (electrons) which enter in gate insulator film 6 are largely affected by the gate electrode. That is, with a larger gate electrode, the holes (electrons) which enter in the gate insulator film are more strongly drawn to the gate electrode.

In a portion of the gate electrode, into which hot carriers are entered, interface states or traps are generated, causing a deterioration in characteristics of MOS field effect transistors. Interface state is an energy level which allows transmission/reception of charges to/from Si substrate in a Si—$SiO_2$ interface region. Trap is a portion that serves to trap or capture conduction electrons or holes contributing to electric conduction to prevent the contribution to electric conduction.

The drain avalanche hot carriers and the channel hot holes (electrons) have the following nature. With reference to FIG. 74, this field effect transistor has an LDD structure. A high concentration source region 19a and a high concentration drain region 19b are formed to be spaced apart from each other in a silicon substrate. A low concentration source region 15a is formed in the inside of high concentration source region 19a, while a low concentration drain region 15b is formed in the inside of high concentration drain region 19b. Sidewall insulating films 13a and 13b are formed on opposite sides of a gate electrode 7.

Respective amounts of injected hot carriers in respective cases where the concentration of low concentration drain region 15*b* is low, medium and high are shown in the figure. Channel hot electrons are denoted with CHE, and drain avalanche hot carriers with DAHC. For the channel hot electrons, its peak value of the amount of injected carriers does not change even if the concentration of low concentration drain region 15*b* changes. For the drain avalanche hot carriers, its peak value (P) of the amount of injected carriers increases with an increase in concentration of low concentration drain region 15*b*. In addition, the peak value (P) of the drain avalanche hot carriers shifts to the side of a channel-region with an increase in concentration of low concentration drain region 15*b*.

As the gate voltage becomes higher, a hot carrier resistivity of nitrided oxide film becomes lower than that of silicon oxide film. This is described as follows. A threshold value ($V_{th}$) is measured before application of stresses, and then stresses are applied. As stresses, the following four conditions are provided: a gate voltage of 1.0 V in absolute value, a drain voltage of 6.0 V and a time of 1000 seconds; a gate voltage of 2.5 V (2.0 V for PMOS) in absolute value, a drain voltage of 6.0 V and a time of 1000 seconds; a gate voltage of 4.0 V in absolute value, a drain voltage of 6.0 V and a time of 1000 seconds; and a gate voltage of 6.0 V in absolute value, a drain voltage of 6.0 V and a time of 1000 seconds. After stresses are applied, threshold values are measured. Thus, the difference between threshold values before and after the application of stresses, i.e., a shift of threshold value is measured. FIG. 75 shows the case with an NMOS field effect transistor, and FIG. 76 shows the case with a PMOS field effect transistor. The lateral axis indicates a gate voltage in the application of stresses. As the amount of generated hot carriers increases, the shift of threshold values increases.

As shown in FIG. 75, in the case with the NMOS field effect transistor, if a gate voltage is lower, the shift of threshold value for nitrided oxygen film is smaller than that for silicon oxide film. That is, the hot carrier resistivity of the nitrided oxide film is higher than that of silicon oxide film. However, if the gate voltage is higher, the shift of threshold values for the nitrided oxide film is larger than that for the silicon oxide film.

In the case with the PMOS field effect transistor shown in FIG. 76, if the absolute value of the gate voltage is smaller, the shift of threshold values for the nitrided oxide film is approximately the same as that for the silicon oxide film. That is, the hot carrier resistivity of the nitrided oxide film is the same as that of the silicon oxide film. However, if the absolute value of the gate voltage is higher, the shift of threshold values for the nitrided oxide film is larger than that for the silicon oxide film.

According to "1982 Symposium on VLSI Technology Digest" p.40 by Eiji Takeda et al, it is disclosed that when a gate voltage is 4 V or less, drain avalanche hot carriers are liable to be generated, and when the gate voltage is 4 V or more, channel hot electrons are liable to be generated. Therefore, as shown in FIG. 75, in the NMOS field effect transistor, the nitrided oxide film is more resistive to drain avalanche hot carriers as compared to the silicon oxide film, and the silicon oxide film is more resistive to channel hot electrons as compared to the nitrided oxide film. In the PMOS field effect transistor, as shown in FIG. 76, both the silicon oxide film and the nitrided oxide film exhibit approximately the same resistivity to drain avalanche hot carriers, and the silicon oxide film is more resistive to channel hot holes as compared to the nitrided oxide film.

In a CMOS (Complementary MOS) circuit, it is possible that either an NMOS transistor or PMOS transistor is put in a high gate voltage state. As has been described above with reference to FIGS. 75 and 76, when the nitrided oxide film is used as a gate insulator film, if the absolute value of a gate voltage is higher than that provided when the silicon oxide film is used as the gate insulator film, the hot carrier resistivity deteriorates in both the NMOS transistor and the PMOS transistor. Accordingly, when the MOS transistor including the nitrided oxide film as the gate insulator film is incorporated into the CMOS circuit, such a disadvantage is provided that the hot carrier resistivity of the circuit decreases as compared to the transistor including the silicon oxide film as the gate insulator film.

FIGS. 77 and 78 are diagrams showing voltage-current characteristics of the MOS field effect transistor disclosed in the aforementioned document, Digest "International Electron Device Meeting 1989," p. 267. FIG. 77 shows the case with the NMOS transistor, and FIG. 78 shows the case with the PMOS transistor. In the figures, a symbol NO indicates a nitrided oxide film, and PO indicates a pure oxide film.

As shown in FIG. 77, when an NMOS field effect transistor including an NO film as a gate insulator film is employed at a lower gate voltage, such an NMOS field effect transistor exhibits a lower current handling capability than that of an NMOS field effect transistor including the pure oxide film as the gate insulator film. As shown in FIG. 78, when a PMOS field effect transistor including the NO film as the gate insulator film is employed, such a PMOS field effect transistor exhibits a lower current handling capability at any gate voltages as compared to a PMOS field effect transistor including the pure oxide film as the gate insulator film. The deterioration in current handling capability means a deterioration in higher speed performance of circuits.

As the number of traps increases, the characteristics of the field effect transistor deteriorates. It is presumed according to an experiment conducted by the inventor of the present application that a nitride film has more traps than a nitrided oxide film. This will be described in embodiments of the invention.

SUMMARY OF THE INVENTION

One object of the present invention is to provide a field effect transistor having an NO film of high hot carrier resistivity at a high gate voltage.

Another object of the present invention is to provide a field effect transistor having a higher hot carrier resistivity at a high gate voltage and a low gate voltage even if including a nitrided oxide film.

A further object of the present invention is to provide a field effect transistor exhibiting a higher current handling capability at a low gate voltage even if including a nitrided oxide film.

A still further object of the present invention is to provide a method of manufacturing a field effect transistor having a higher hot carrier resistivity at a high gate voltage even if including a nitrided oxide film.

A still further object of the present invention is to provide a method of manufacturing a field effect transistor having a nitrided oxide film of a lower interface state.

A still further object of the present invention is to provide a method of manufacturing a field effect transistor having two types of nitrided oxide films with different nitrogen concentrations.

A still further object of the present invention is to provide a method of manufacturing a field effect transistor having a further improved hot carrier resistivity.

A still further object of the present invention is to provide a method of manufacturing a field effect transistor exhibiting an improved current handling capability at a low gate voltage.

According to a first aspect of the present invention, a field effect transistor is provided which includes a nitrided oxide film formed on a main surface of a semiconductor substrate, and an oxide film formed on the main surface and having a nitrogen concentration equal to zero or lower than a nitrogen concentration in the nitrided oxide film. Channel hot carriers represent channel hot holes and channel hot electrons.

According to a second aspect of the present invention, a field effect transistor is provided which includes a nitrided oxide film formed on a main surface of a semiconductor substrate and having a nitrogen concentration increasing from a source region to a drain region.

According to a third aspect of the present invention, a method of manufacturing a field effect transistor includes the steps of: forming a silicon oxide film on a main surface of a semiconductor substrate; forming a gate electrode on the silicon oxide film; and processing a silicon oxide film located near a side portion of the gate electrode into a nitrided oxide film.

According to a fourth aspect of the present invention, a method of manufacturing a field effect transistor includes the steps of: forming a silicon oxide film on a main surface of a semiconductor substrate; forming a gate electrode on the silicon oxide film; removing the silicon oxide film located near a side portion of the gate electrode; and forming a nitrided oxide film in a place where the silicon oxide film is removed.

According to a fifth aspect of the present invention, a method of manufacturing a field effect transistor includes the steps of: forming a first nitrided oxide film on a main surface of a semiconductor substrate; forming a gate electrode on the first nitrided oxide film; removing the first nitrided oxide film located near a side portion of the gate electrode; and forming a second nitrided oxide film having a nitrogen concentration higher than that of the first nitrided oxide film in a place where the first nitrided oxide film is removed.

According to a sixth aspect of the present invention, a field effect transistor includes a gate electrode and a sidewall film which are formed on a nitrided oxide film.

According to a seventh aspect of the present invention, a field effect transistor includes: a semiconductor substrate having a major surface; source and drain regions spaced apart from each other in the major surface of the substrate and defining a channel region therebetween; a gate insulating film overlying at least the channel region on the major surface of the substrate; and a gate electrode on the gate insulating film; wherein the gate insulating film includes, respectively, first and second regions of silicon oxide and nitrided oxide.

The first aspect of the present invention will now be described. Hot carriers at a high gate voltage are mainly channel hot carriers. According to the first aspect of the present invention, an oxide film is formed on the channel hot carrier injection region in the main surface of the semiconductor substrate. Since the oxide film is resistive to channel hot carriers, the oxide film exhibits a higher resistivity to hot carriers at a high gate voltage. Hot carriers at a low gate voltage are mainly drain avalanche hot carriers. According to the first aspect of the present invention, the nitrided oxide film is formed on the drain avalanche hot carrier injection region in the main surface of the semiconductor substrate. The nitrided oxide film is resistive to drain avalanche hot carriers.

According to the second aspect of the present invention, the same function as that in the first aspect is accomplished by increasing a nitrogen concentration in the nitrided oxide film to be higher from a source region to a drain region.

According to the third aspect of the present invention, the silicon oxide film is formed on the main surface of the semiconductor substrate including the channel hot carrier injection region. This makes it possible to manufacture a structure provided in the case where a nitrogen concentration in the oxide film is zero in the first aspect.

The fourth aspect of the present invention will now be described. If a silicon oxide film is damaged by etching or the like, an interface state included in the film increases. If this silicon oxide film forms a nitrided oxide film, the nitrided oxide film includes a higher interface state. According to the fourth aspect of the present invention, such a nitrided oxide film is not formed since the silicon oxide film located on the drain avalanche hot carrier injection region is removed to form a new nitrided oxide film.

According to the fifth aspect of the present invention, a field effect transistor including two types of nitrided oxide films having different nitrogen concentrations can be manufactured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A first embodiment

Figure 1:
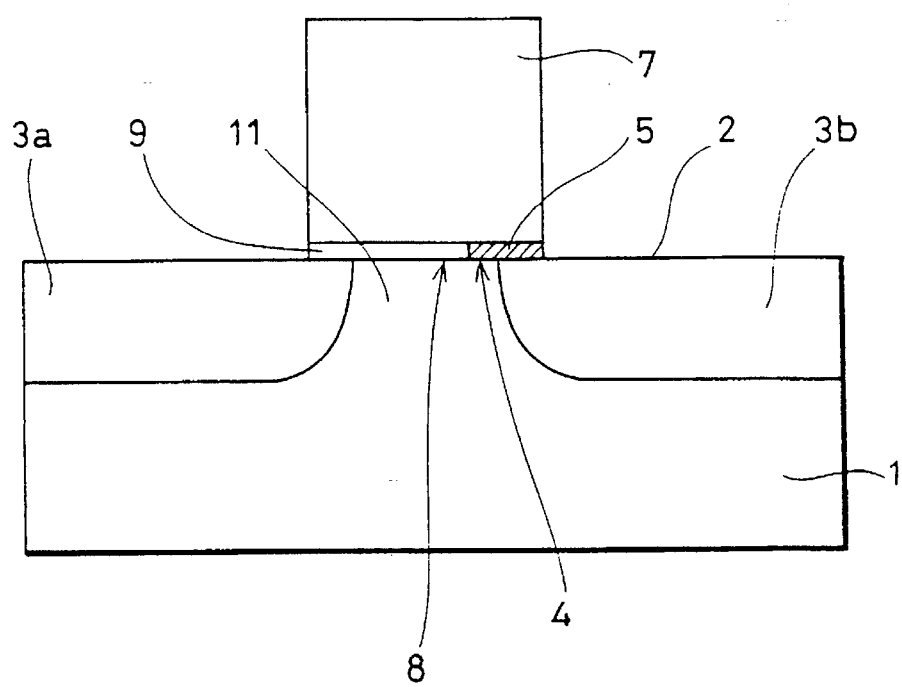
FIG. 1 is a schematic cross-sectional view of a first embodiment of a field effect transistor in accordance with the present invention.

FIG. 1 is a schematic cross-sectional view of a first embodiment of a field effect transistor in accordance with the present invention. A source region 3a and a drain region 3b are formed with a spacing from each other in a silicon substrate 1. Silicon substrate 1 has a main surface 2. A nitrided oxide film 5 is formed on a drain avalanche hot carrier injection region in main surface 2. A silicon oxide film 9 (typically $SiO_2$) is formed on a channel hot hole (electron) injection region in main surface 2. Nitrided oxide film 5 and silicon oxide film 9 constitute a gate insulator film.

Channel hot holes (electrons) and drain avalanche hot carriers are both generated near drain region 3b. However, channel hot holes (electrons) are generated in a higher gate voltage state as compared to drain avalanche hot carriers. Thus, holes (electrons) injected into the gate insulator film in the case of the channel hot hole (electron) phenomenon are more affected by a gate voltage as compared to holes (electrons) injected into the gate insulator film in the case of the drain avalanche hot carrier phenomenon. Thus, a channel hot hole (electron) injection region 8 is located closer to source region 3a than a drain avalanche hot carrier injection region 4. A gate electrode is denoted by a reference numeral 7. As a material of the gate electrode, any of (1) polycrystalline silicon, (2) metal and (3) stacked polycrystalline silicon and silicide may be employed.

A description will now be made on the fact that a trap density of a nitrided oxide film is lower than that of a silicon oxide film. It is known that the trap density of a silicon nitride film is 100 to 1000 times higher than that of the silicon oxide film. This is disclosed in, for example, "THE Si—SiO$_2$ SYSTEM" by Pieter Balk, p. 32, *MATERIALS SCIENCE MONOGRAPHS*, publ. by Elsevier.

Figure 2:
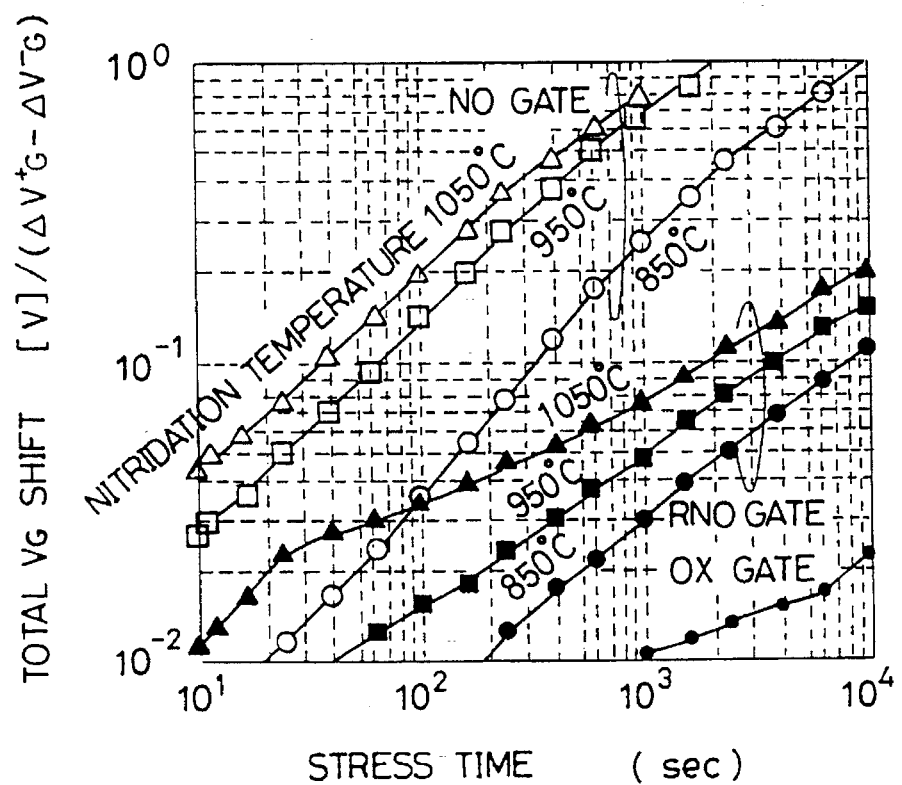
FIG. 2 is a graph showing the relationship between STRESS TIME and TOTAL $V_G$ SHIFT provided at different nitridation temperatures.

FIG. 2 is a graph disclosed in an article entitled "IEDM91 HOT-CARRIER-RESISTANT STRUCTURE BY RE-OXIDIZED NITRIDED OXIDE SIDEWALL FOR HIGHLY RELIABLE AND HIGH PERFORMANCE LDD MOSFETS" presented by the inventors of the present application on Dec. 8, 1991. Referring to FIG. 2, STRESS TIME is a time for which an FN current flows. The FN current is a current flowing through a gate electrode and a substrate. TOTAL $V_G$ SHIFT is the difference between a gate voltage provided when the FN current starts to flow and that provided after the FN current flows for a predetermined time period. RNO is a nitrided oxide film, and OX is a silicon oxide film. NO is a film that is not re-oxidized after nitrided. Temperatures shown in the graph are nitridation temperatures.

As can be seen from the graph, the total $V_G$ shift of an RNO gate is ten times lower than that of an OX gate. Since the trap density is in proportion to the total $V_G$ shift, it is considered that the trap density of RNO is ten times lower than that of OX. Accordingly, it is found that the trap density of RNO is lower than that of the silicon nitride film.

Figure 75:
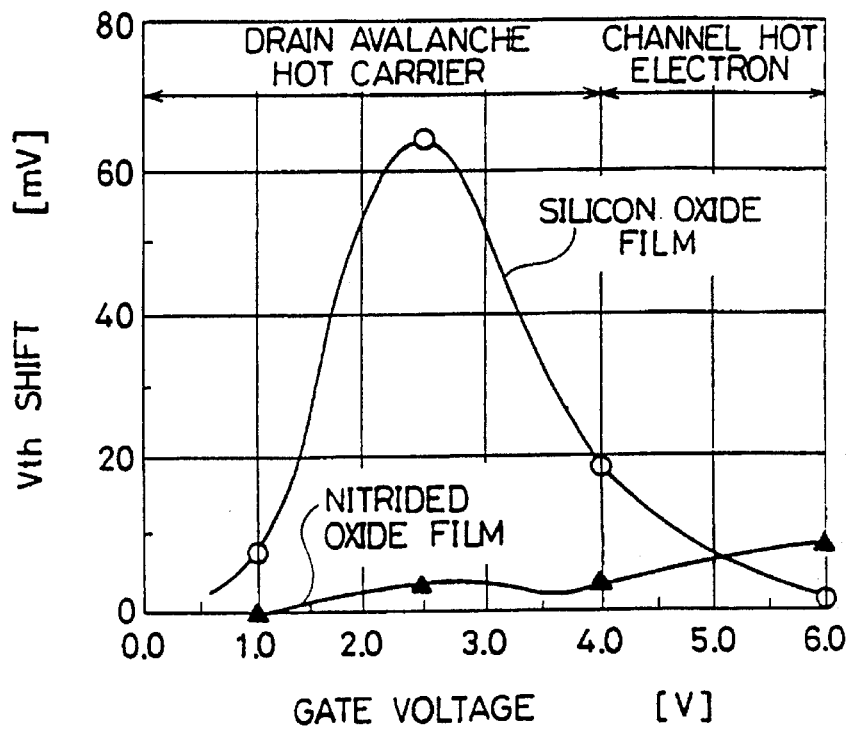
FIG. 75 is a graph showing the relationship between gate voltage and $V_{th}$ shift in each of cases where a gate insulator film of an NMOS field effect transistor is a nitrided oxide film and where it is a silicon oxide film.
Figure 76:
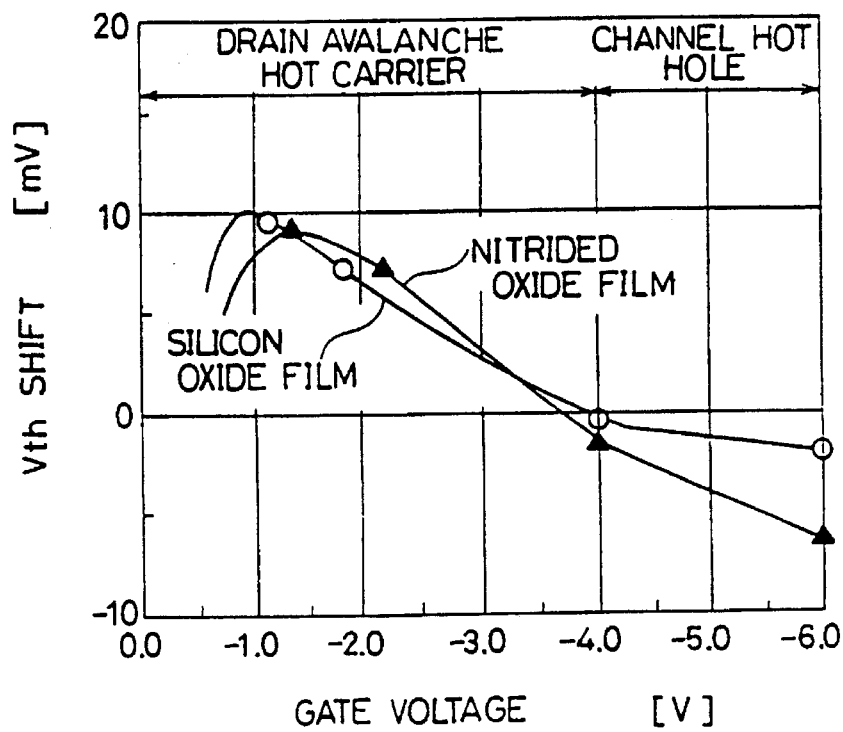
FIG. 76 is a graph showing the relationship between gate voltage and $V_{th}$ shift in each of the cases where a gate insulating film of a PMOS field effect transistor is a nitrided oxide film and where it is a silicon oxide film.
Figure 77:
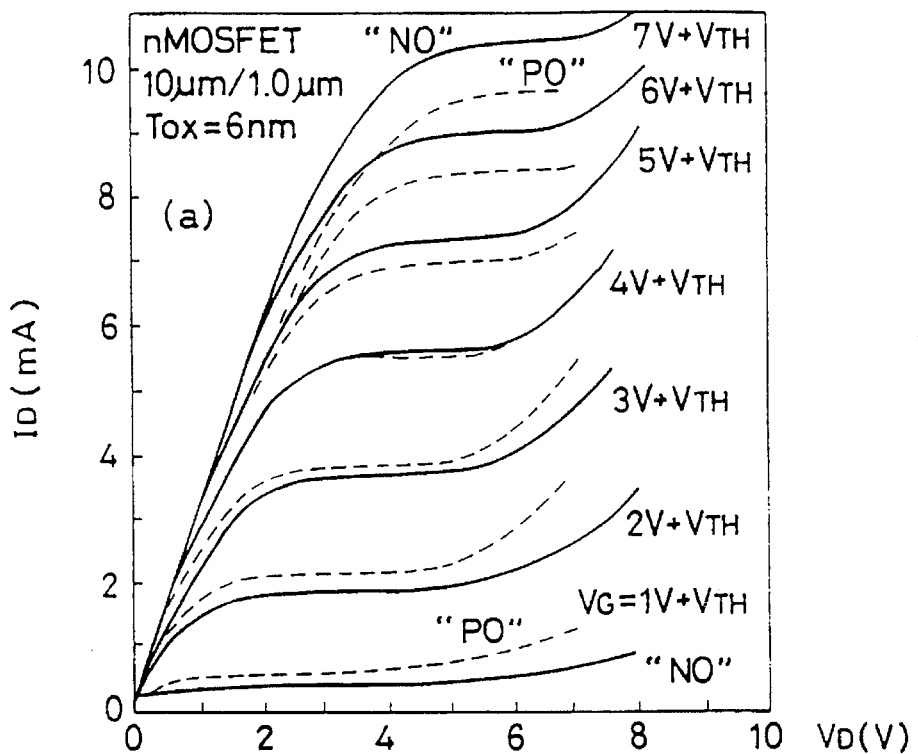
FIG. 77 is a graph showing characteristics of current handling capabilities in each of the cases where a gate insulator film of an NMOS field effect transistor is a nitrided oxide film and where it is a silicon oxide film.
Figure 78:
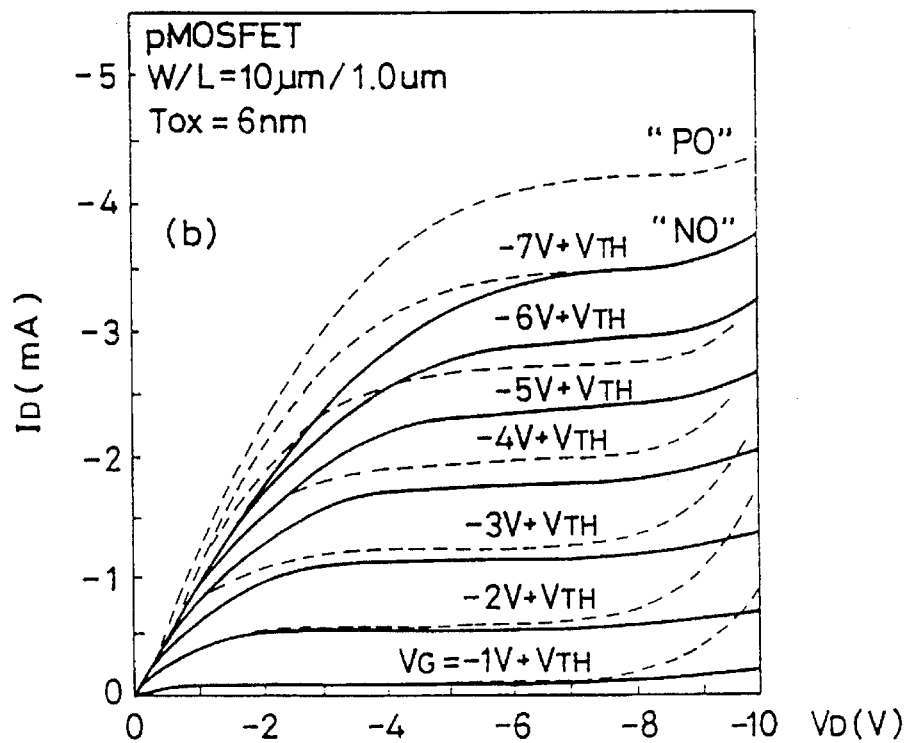
FIG. 78 is a graph showing characteristics of current handling capabilities in each of the cases where the gate insulating film of a PMOS field effect transistor is a nitrided oxide film and where it is a silicon oxide film.

The field effect transistor of FIG. 1 is hot-carrier resistant at the time of a high gate voltage (for the PMOS case, when an absolute value is a high gate voltage) as shown in FIGS. 75 and 76, as compared to the case where the entire gate insulator film is formed of a nitrided oxide film. When the field effect transistor of FIG. 1 is of an NMOS type, the transistor is hot-carrier resistant also at the time of a low gate voltage as shown in FIG. 75. When the field effect transistor of FIG. 1 is of the NMOS type, a current handling capability increases at a low gate voltage as compared to the field effect transistor including the gate insulator film entirely formed of a nitrided oxide film, as can be seen from FIG. 77. When the field effect transistor of FIG. 1 is a PMOS type, a current handling capability increases at any gate voltage as compared to the transistor including the gate insulator film entirely formed of the nitrided oxide film, as shown in FIG. 78.

Figure 3:
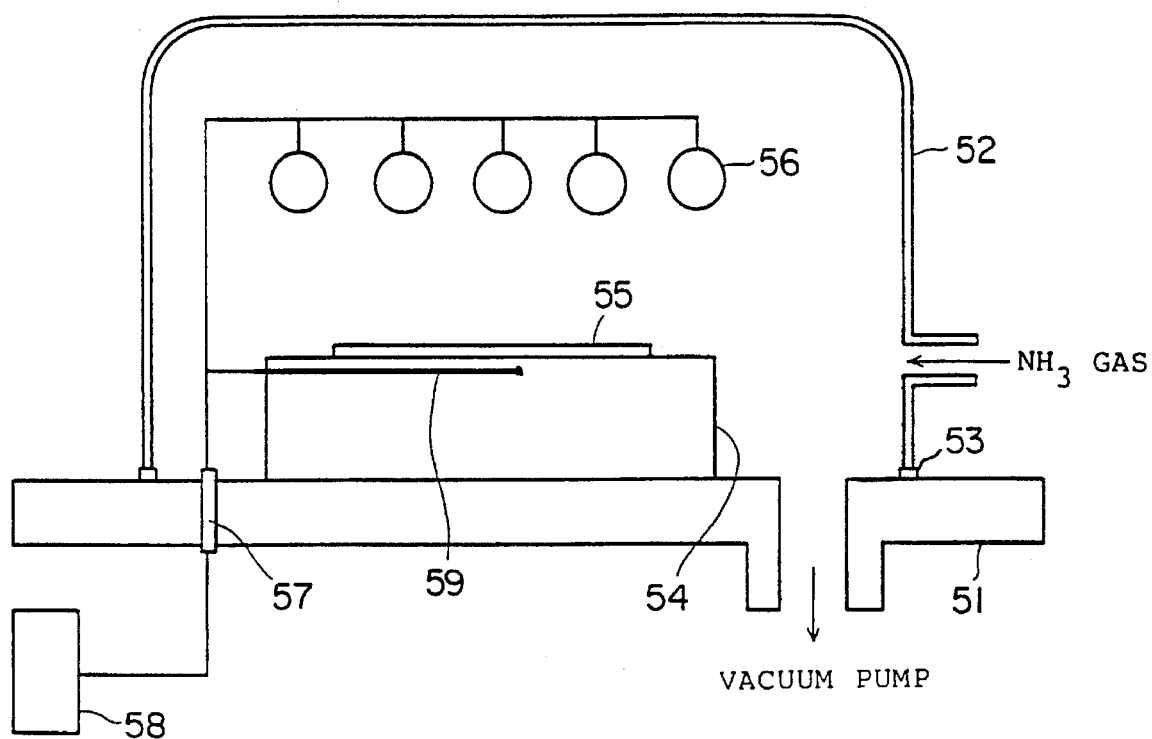
FIG. 3 is a schematic diagram of a lamp annealing apparatus.

A lamp annealing apparatus for use in formation of a nitrided oxide film will now be described. FIG. 3 is a schematic diagram of the lamp annealing apparatus. A chamber 52 is located on a main body 51 of the apparatus. A packing 53 for retaining the inside of chamber 52 in a vacuum state is attached between chamber 52 and main body 51.

A wafer support 54 is provided in chamber 52, and silicon wafer 55 is placed on wafer support 54. A lamp 56 is provided above silicon wafer 55. Lamp 56 is electrically connected through a power supply deriving terminal 57 to a power supply and control system 58 outside main body 51.

A thermocouple 59 provided near silicon wafer 55 is likewise electrically connected through power supply deriving terminal 57 to power supply and control system 58. An output of power supply and control system 58 is controlled in accordance with a temperature measured by thermocouple 59, so as to set a temperature in chamber 52 to a desired temperature. In addition, in order to make an annealing atmosphere changing, chamber 52 can be made vacuum by a vacuum pump. Also, an ammonium gas or the like is allowed to be introduced into chamber 52.

Figure 4:
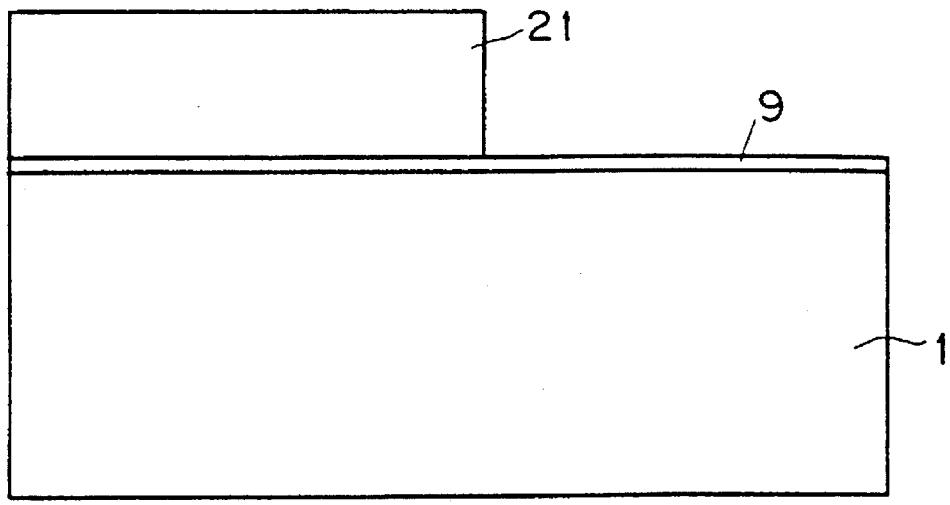
FIGS. 4–7 are cross-sectional views showing, respectively, first, second, third and fourth steps of a manufacturing method of the first embodiment of the field effect transistor according to the present invention.

A description will now be made on a manufacturing method of a first embodiment of a field effect transistor according to the present invention. With reference to FIG. 4, a main surface of a silicon substrate 1 is oxidized to form a silicon oxide film 9 of approximately 100 Å in thickness. An anti-nitridation mask 21 made of polycrystalline silicon of approximately 2000 Å in thickness is then formed on silicon oxide film 9, and is then processed in a desired form by employing photolithography and etching. An etching rate of anti-nitridation mask 21 is greatly different from that of silicon oxide film 9, and anti-nitridation mask 21 is required to have a nature of preventing nitridation of a film lying beneath anti-nitridation mask 21. From this view point, polycrystalline silicon is employed as a material of anti-nitridation mask 21.

Figure 5:
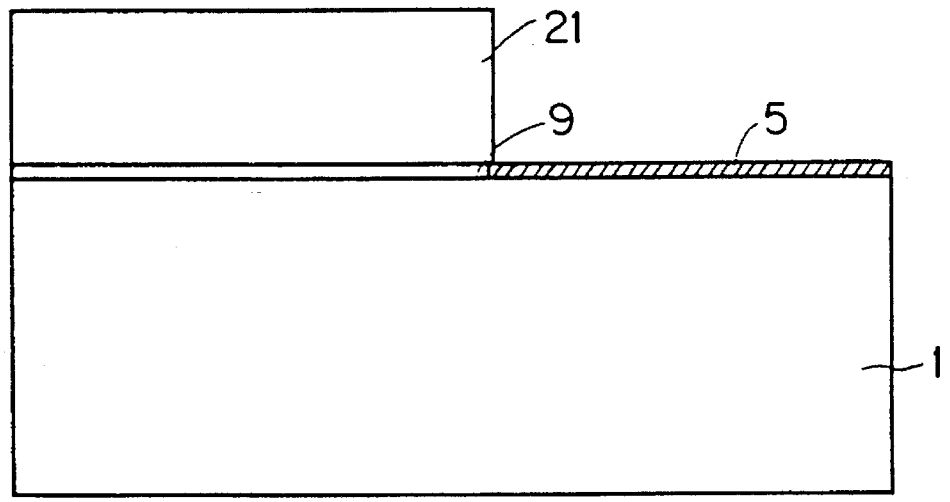

As shown in FIG. 5, a nitrided oxide film 5 is formed by lamp annealing. The lamp annealing is carried out by employing the apparatus shown in FIG. 3. Conditions are: a temperature in the chamber is 900° C.; an atmosphere includes 100% of ammonium gas; and time is approximately 30 seconds. The nitrided oxide film may be oxidized or annealed, if necessary, in an oxygen atmosphere or an inert gas.

Figure 6:
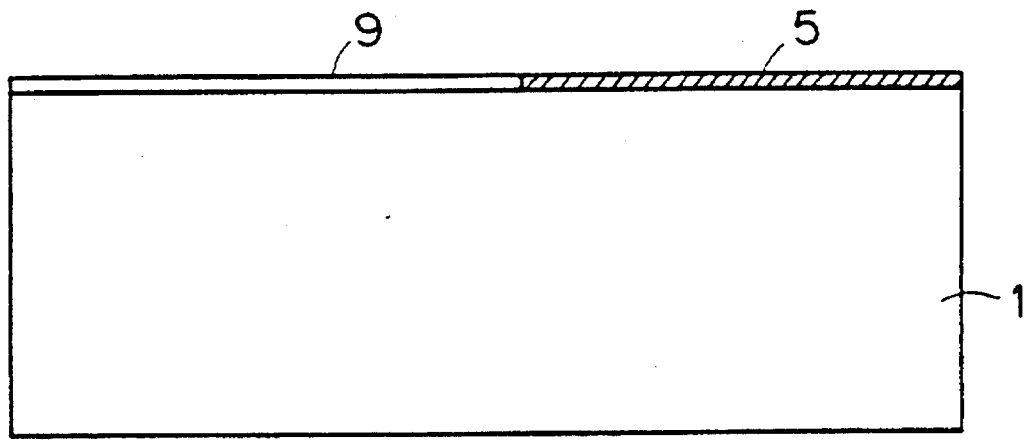
Figure 7:
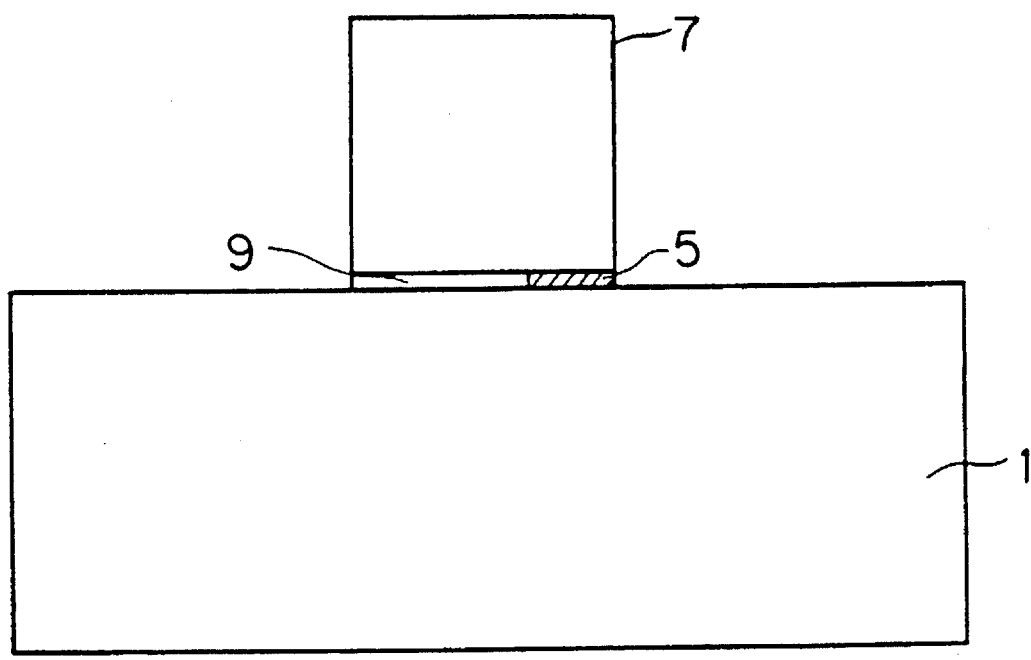

Anti-nitridation film 21 is removed as shown in FIG. 6. A polycrystalline silicon film is then formed on silicon oxide film 9 and nitrided oxide film 5, and a gate electrode 7 is formed as shown in FIG. 7 by employing photolithography and etching. Implanting ions into silicon substrate 1 with gate electrode 7 used as a mask completes the first embodiment of the field effect transistor according to the present invention shown in FIG. 1.

Figure 8:
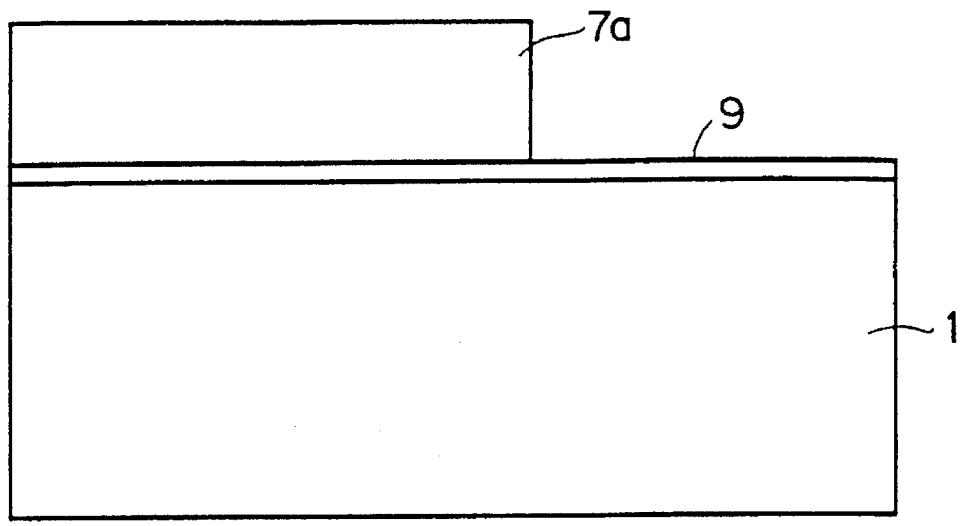
FIGS. 8–12 are cross-sectional views showing, respectively, first, second, third, fourth and fifth steps of another example of the manufacturing method of the first embodiment of the field effect transistor according to the present invention.

A description will now be made on another example of the manufacturing method of the first embodiment of the field effect transistor according to the present invention. A silicon oxide film 9 of approximately 100 Å in thickness is formed on a main surface of a silicon substrate 1 as shown in FIG. 8. An N type polycrystalline silicon film 7a is then formed on silicon oxide film 9. Its thickness is set to approximately 3000 Å. Polycrystalline silicon film 7a is then processed in a desired form by employing photolithography and etching.

Figure 9:
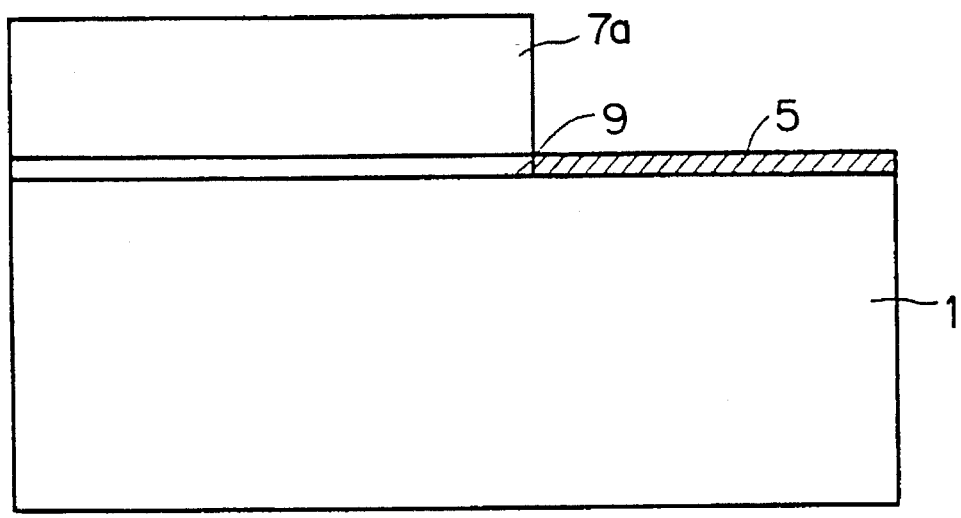
Figure 10:
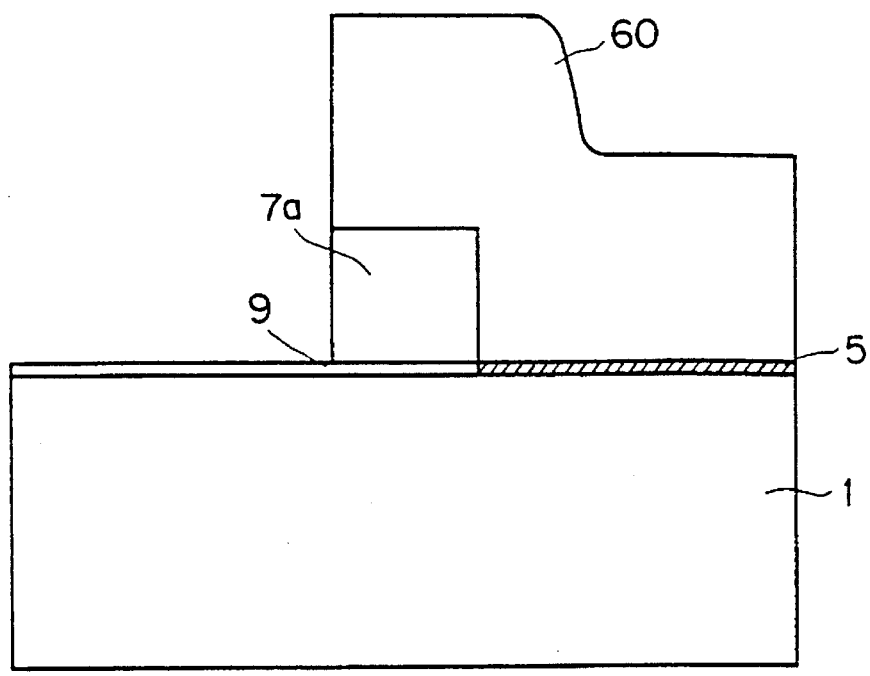

A nitrided oxide film 5 is formed by lamp annealing as shown in FIG. 9. Conditions are made identical to the previous conditions. As shown in FIG. 10, polycrystalline silicon film 7a is processed in a desired shape by using photolithography and etching. A photoresist is denoted with a reference numeral 60.

Figure 11:
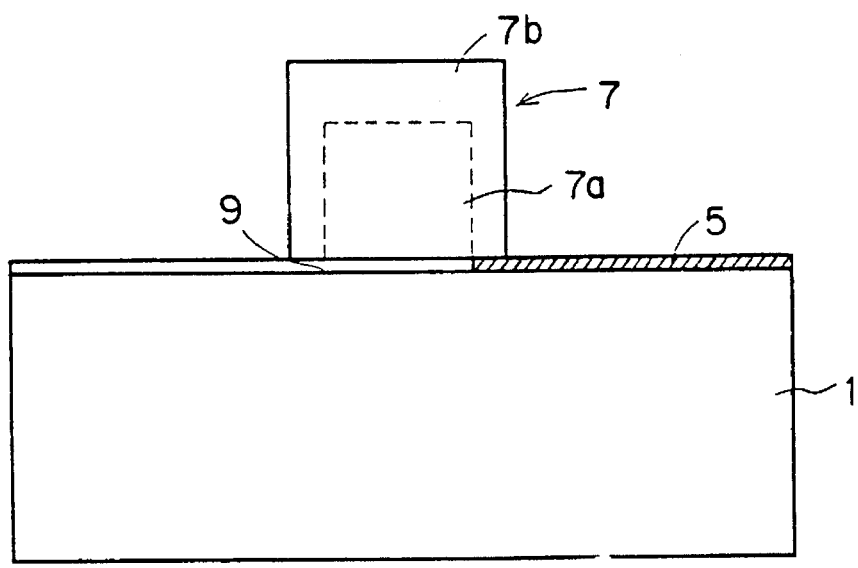

With reference to FIG. 11, after removal of photoresist 60, a temperature is raised in a mixed gas of hydrogen chloride and silane, whereby a polycrystalline silicon film 7b is selectively formed on a surface of polycrystalline silicon film 7a, to form a gate electrode 7. Polycrystalline silicon film 7b is located on nitrided oxide film 5.

Figure 12:
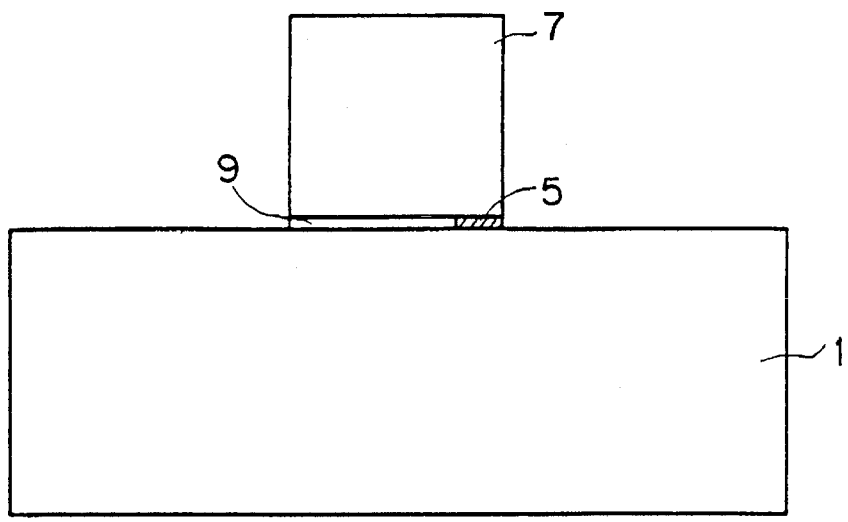

As shown in FIG. 12, silicon oxide film 9 and nitrided oxide film 5 located on opposite sides of gate electrode 7 are removed. Implanting ions into silicon substrate 1 with gate electrode 7 used as a mask forms a source region and a drain region, thereby completing the first embodiment of the field effect transistor according to the present invention shown in FIG. 1.

A second embodiment

Figure 13:
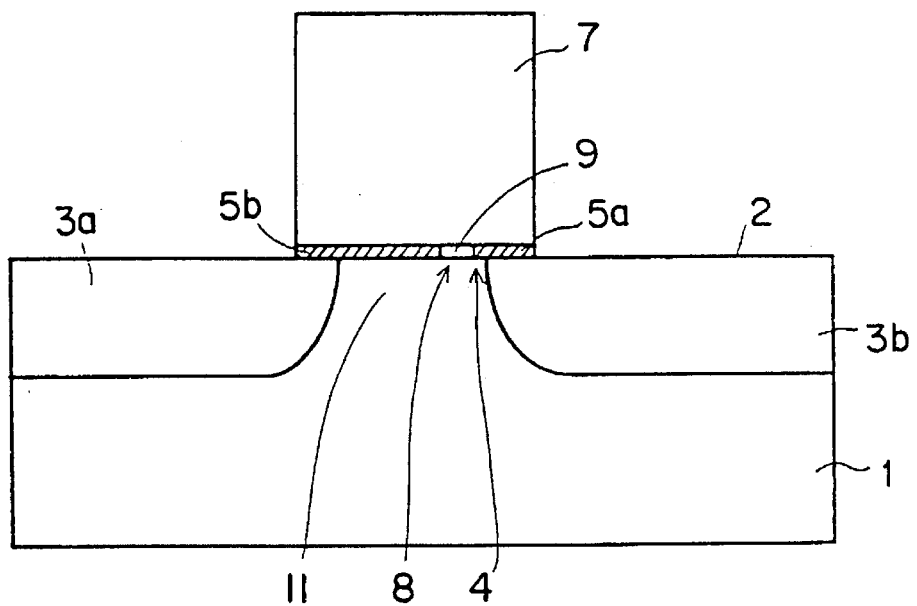
FIG. 13 is a schematic cross-sectional view of a second embodiment of a field effect transistor according to the present invention.

FIG. 13 is a schematic cross-sectional view of a second embodiment of a field effect transistor according to the present invention. Identical members to those of the field effect transistor shown in FIG. 1 are denoted with identical reference numerals. The second embodiment is identical to the first embodiment in the respect that nitrided oxide film 5a is formed on drain avalanche hot carrier injection region 4 and that silicon oxide film 9 is formed on channel hot hole (electron) injection region 8. However, this embodiment is different from the first embodiment in that a nitrided oxide film 5b is formed in a certain region between source region 3a and channel hot hole (electron) injection region 8 in main surface 2. In the second embodiment, since most of a gate insulation film is a nitrided oxide film, a current handling capability decreases at a low gate voltage in the NMOS field effect transistor as compared to the first embodiment (see FIG. 77). However, the nitrided oxide film exhibits a larger effect of preventing diffusion of boron as compared to the silicon oxide film. Thus, when boron is doped into the gate electrode, diffusion of boron into a channel region can be prevented in this second embodiment in which a large volume of the gate insulation film is a nitrided oxide film.

Figure 14:
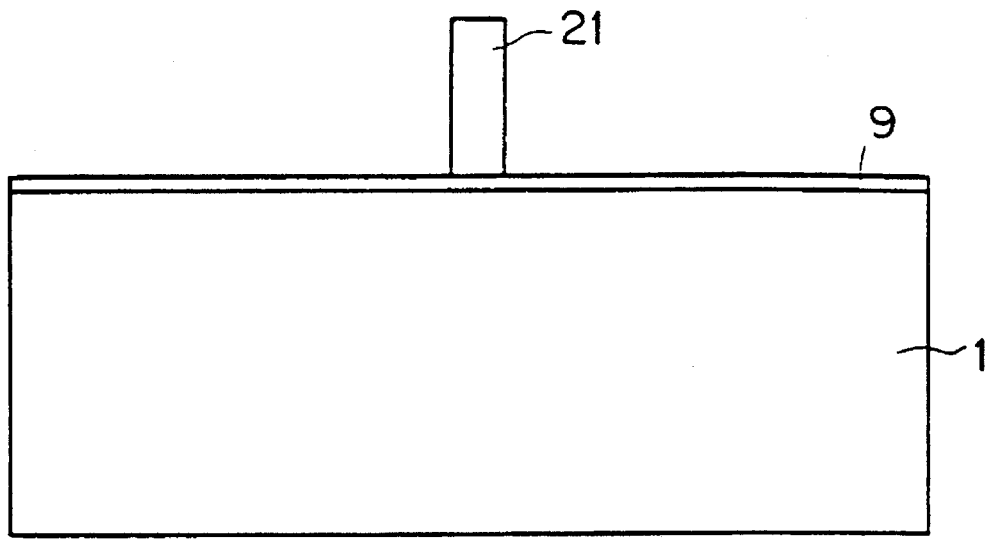
FIG. 14–17 are cross-sectional views showing, respectively, first, second, third and fourth steps of a manufacturing method of the second embodiment of the field effect transistor according to the present invention.

A description will now be made on a manufacturing method of the second embodiment of the field effect transistor according to the present invention. With reference to FIG. 14, a silicon oxide film 9 is formed on a main surface of a silicon substrate 1, and an anti-nitridation mask 21 is formed on silicon oxide film 9. A material of anti-nitridation mask 21 is the same as that in the first embodiment. Anti-nitridation mask 21 is then subjected to a predetermined patterning by employing photolithography and etching.

Figure 15:
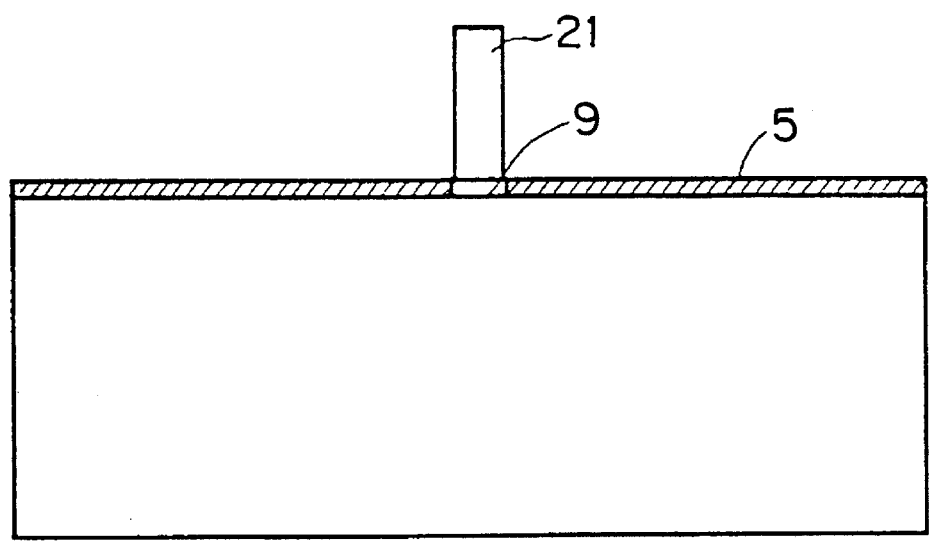

As shown in FIG. 15, a nitrided oxide film 5 is formed by employing the lamp annealing apparatus shown in FIG. 3. A film underlying anti-nitridation mask 21 is not nitrided and remains silicon oxide film 9.

Figure 16:
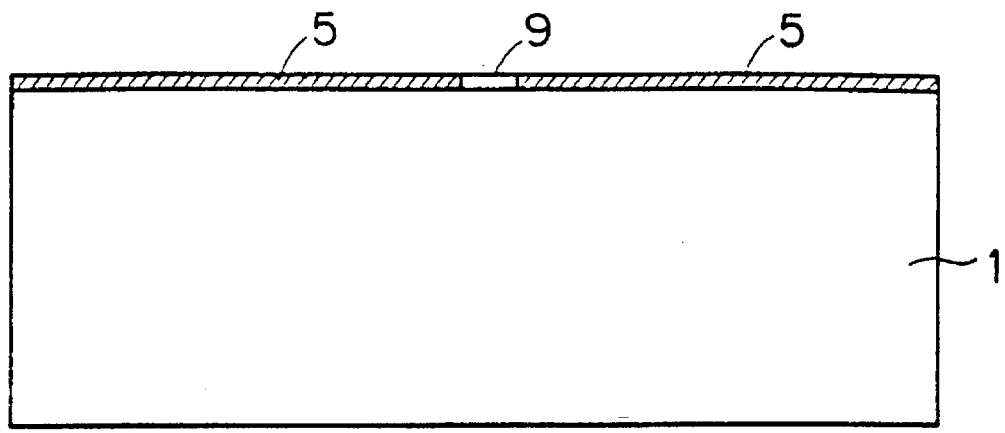
Figure 17:
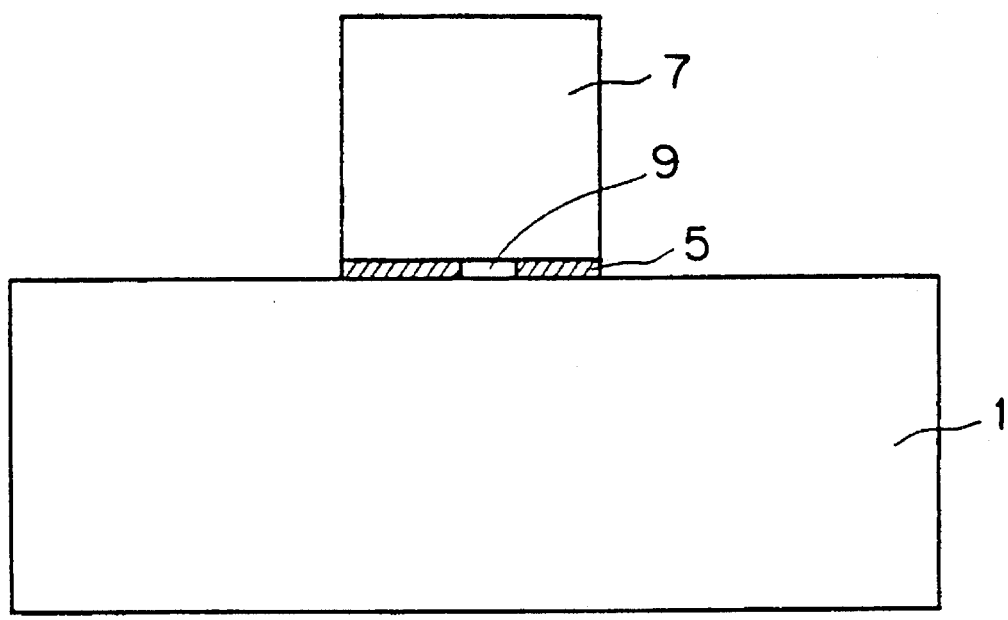

With reference to FIG. 16, anti-nitridation mask 21 is removed. A polycrystalline silicon film is then formed on silicon oxide film 9 and a nitrided oxide film 5. As shown in FIG. 17, this polycrystalline silicon film is subjected to a predetermined patterning to form a gate electrode 7. Implanting ions into silicon substrate 1 with gate electrode 7 used as a mask forms a source region and a drain region, thereby completing the second embodiment of the field effect transistor according to the present invention shown in FIG. 13.

A third embodiment

Figure 18:
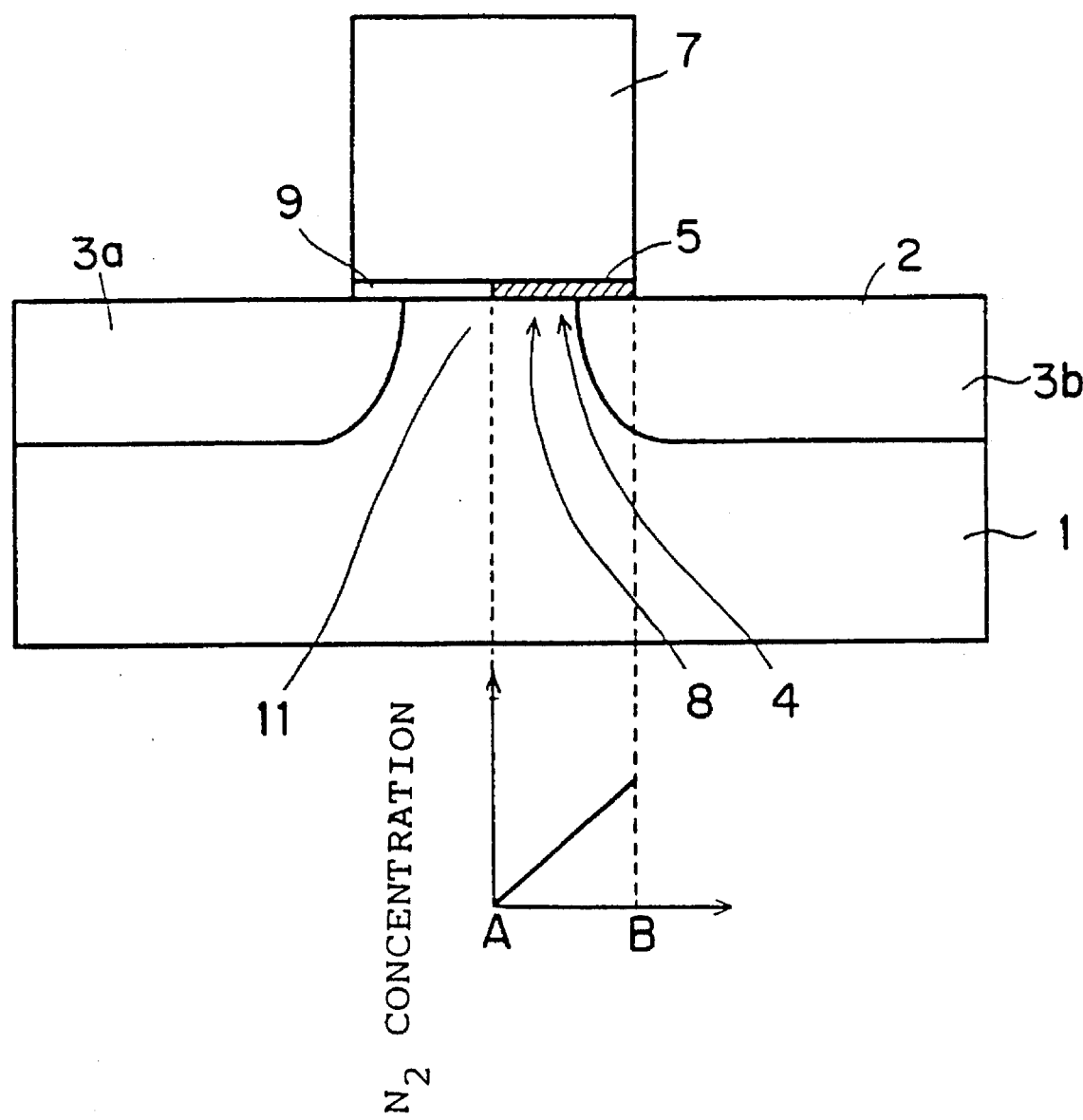
FIG. 18 is a schematic cross-sectional view of a third embodiment of a field effect transistor according to the present invention.

FIG. 18 is a schematic cross-sectional view of a third embodiment of a field effect transistor in accordance with the present invention. Identical constituent members to those of the field effect transistor of FIG. 1 are denoted with identical reference numerals. In the third embodiment, nitrided oxide film 5 is formed also on channel hot hole (electron) injection region 8. A nitrogen concentration in nitrided oxide film 5 becomes higher from a point A to a point B. As the nitrogen concentration in the nitrided oxide film becomes lower, a channel hot hole (electron) resistivity improves. Also, as the nitrogen concentration in the nitrided oxide film becomes higher, a drain avalanche hot carrier resistivity improves. This will be described later.

Figure 19:
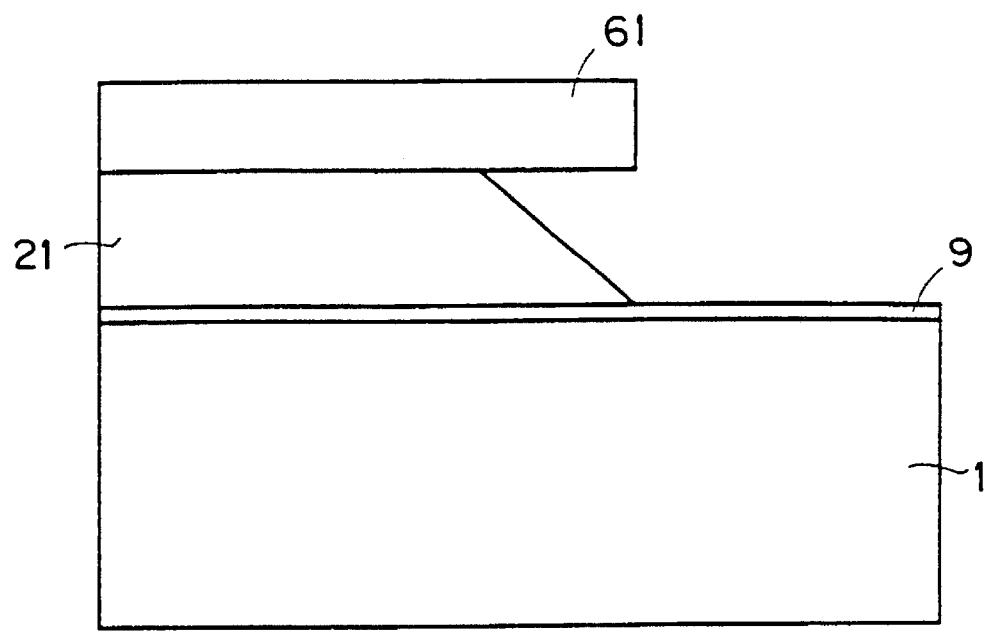
FIGS. 19–22 are cross-sectional views showing, respectively, first, second, third and fourth steps of a manufacturing method of the third embodiment of the field effect transistor according to the present invention.

A description will now be made on a manufacturing method of the third embodiment of the field effect transistor according to the present invention. With reference to FIG. 19, a silicon oxide film 9 is formed on a main surface of a silicon substrate 1, and an anti-nitridation mask 21 is formed on silicon oxide film 9. A material of anti-nitridation mask 21 is made identical to that in the first embodiment. A resist 61 is formed on anti-nitridation mask 21. Resist 61 is then subjected to a predetermined patterning. Anti-nitridation mask 21 is etched by employing highly isotropic etching, with resist 61 used as a mask. This results in a tapered side surface of anti-nitridation mask 21. Resist 61 is then removed.

Figure 20:
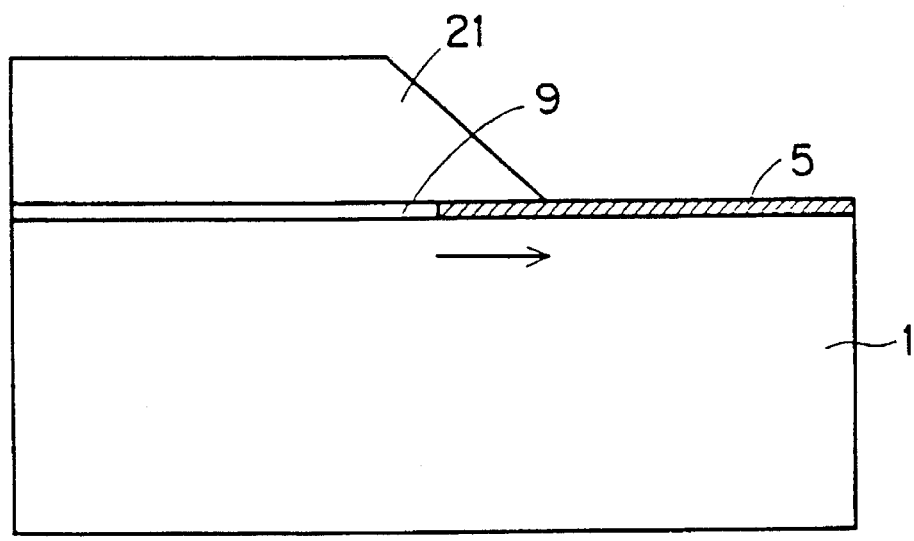

With reference to FIG. 20, a nitrided oxide film 5 is formed by employing the lamp annealing apparatus shown in FIG. 3. In a tapered portion of anti-nitridation mask 21, as a thickness of anti-nitridation mask 21 becomes decreased, silicon oxide film 9 underlying the mask 21 becomes more likely to be nitrided. This enables formation of nitrided oxide film 5 whose nitrogen concentration becomes higher toward an arrowed direction.

Figure 21:
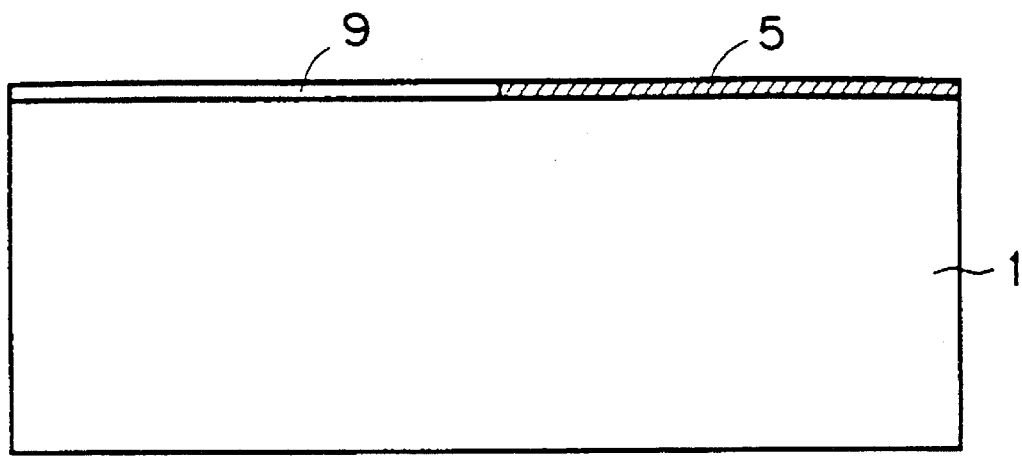
Figure 22:
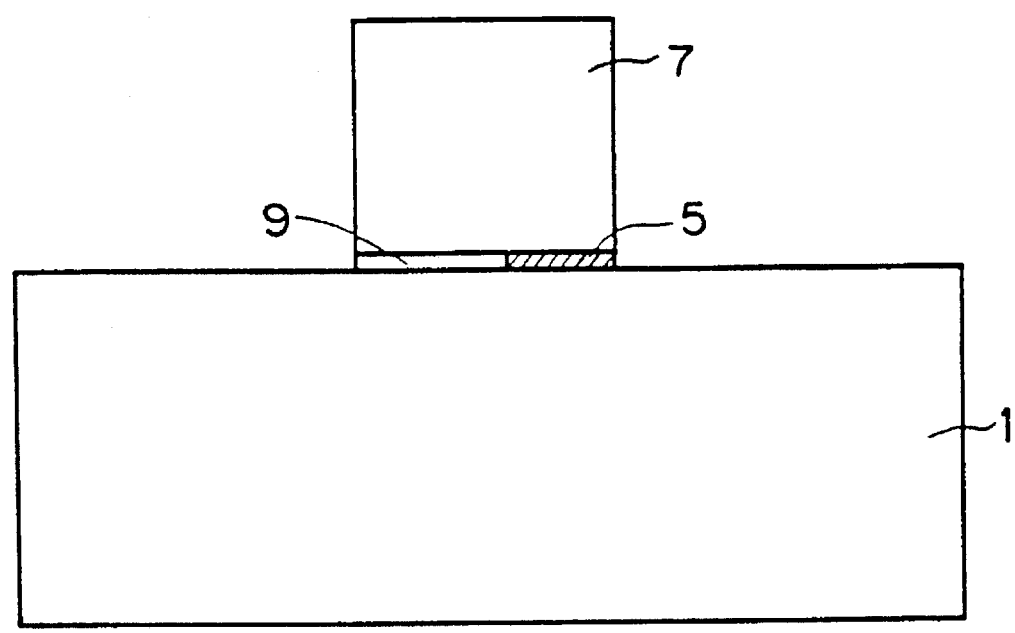

Anti-nitridation mask 21 is removed as shown in FIG. 21. A polycrystalline silicon film is then formed on silicon oxide film 9 and nitrided oxide film 5. The polycrystalline silicon film is subjected to a predetermined patterning to form a gate electrode 7 as shown in FIG. 22. Implanting ions into silicon substrate 1 with gate electrode 7 used as a mask forms a source region and a drain region, thereby completing the third embodiment of the field effect transistor according to the present invention shown in FIG. 18.

A fourth embodiment

Figure 23:
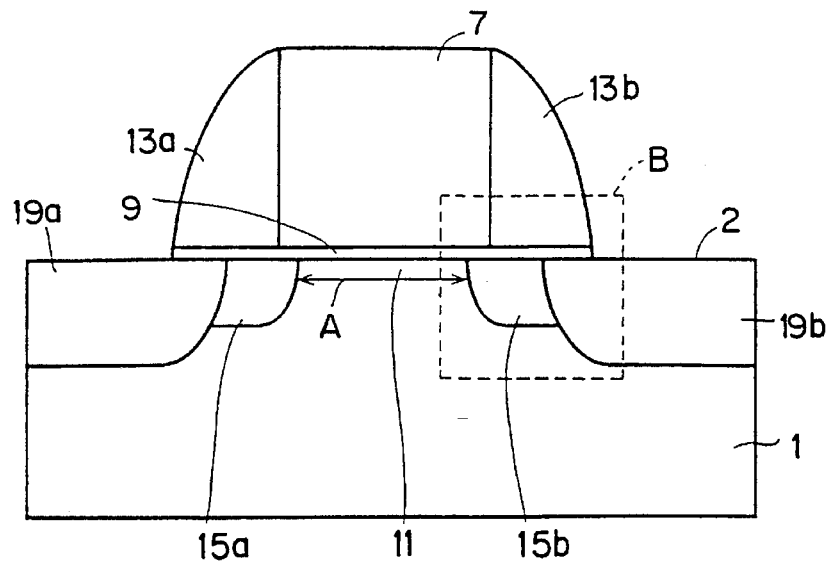
FIG. 23 is a schematic cross-sectional view of a field effect transistor having a conventional LDD structure.

FIG. 23 is a schematic cross-sectional view of an NMOS transistor having a conventional LDD (Lightly Doped Drain) structure. Identical members to those of the field effect transistor shown in FIG. 1 are denoted with identical reference numerals. A low concentration drain region 15b is formed inside a high concentration drain region 19b. A low concentration source region 15a is formed inside a high concentration source region 19a. Sidewall insulator films 13a and 13b are formed on opposite sides of a gate electrode 7.

When a channel length A is 0.6 μm or more, low concentration drain region 15b can be formed by using phosphorus. However, if channel length A becomes smaller, low concentration drain region 15b must be formed by using arsenic having a smaller thermal diffusion coefficient than that of phosphorus. However, since an impurity profile shows a sharp gradient by the use of arsenic, an electric field is focused at an interface between low concentration drain region 15b and high concentration drain region 19b and at an interface between low concentration drain region 15b and a channel region 11. Impact ionization is liable to occur in the places where the electric field is focused, and hence, drain avalanche hot carriers are easily generated.

Figure 24:
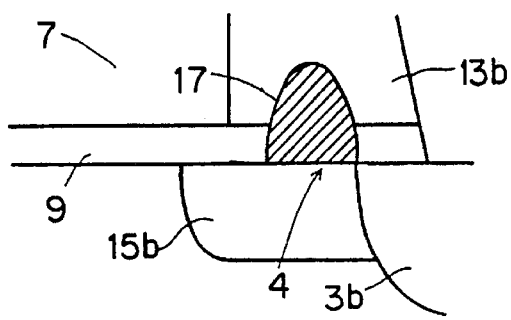
FIG. 24 is an enlarged view of a part denoted with a reference character B of FIG. 23.

In the LDD structure, damage 17 is caused in a sidewall insulator film 13b as shown in FIG. 24 at a gate voltage at which drain avalanche hot carriers are generated. This is disclosed in the above-described article which is to be presented by the inventor of the present application. This damage is an interface state or traps. The damage considerably deteriorates transconductance. The transconductance is a reciprocal number of resistance when a transistor is turned on. With the deterioration in transconductance, the current flowing through the transistor decreases.

Figure 25:
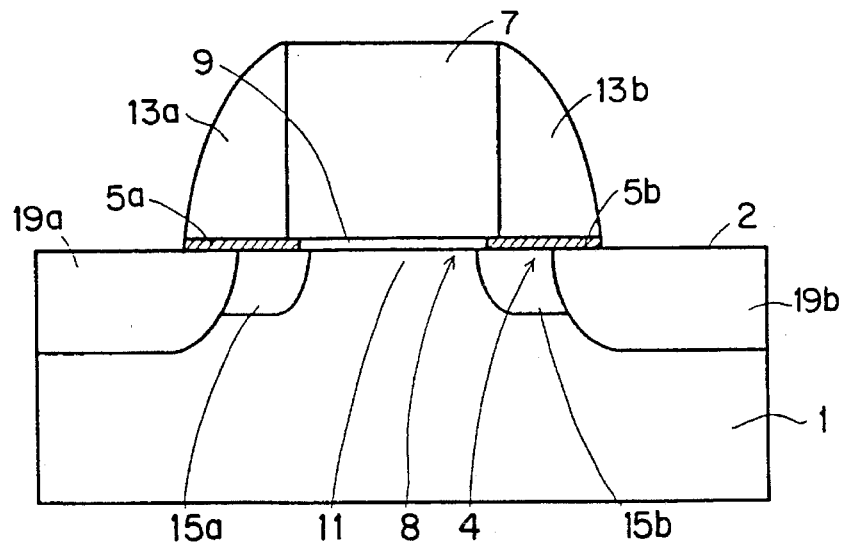
FIG. 25 is a schematic cross-sectional view of a fourth embodiment of a field effect transistor in accordance with the present invention.

The present invention is also applicable to a field effect transistor having an LDD structure. FIG. 25 is a schematic cross-sectional view of a fourth embodiment of a field effect transistor in accordance with the present invention. A high concentration source region 19a and a high concentration drain region 19b are formed with a spacing from each other in a silicon substrate 1. The concentration of the high concentration drain/source region is $1\times10^{20}/cm^3$ or more. A low concentration source region 15a and a low concentration drain region 15b are formed inside of high concentration source region 19a and high concentration drain region 19b. The concentration of the low concentration drain/source region is $1\times10^{17}/cm^3$ or more. A silicon oxide film 9 and nitrided oxide films 5a and 5b are formed on a main surface of silicon substrate 1. A gate electrode 7, a sidewall insulator film 13a and a sidewall insulator film 13b are formed on silicon oxide film 9, nitrided oxide film 5a and nitrided oxide film 5b, respectively.

Drain avalanche hot carriers are generated in a portion where the gradient of impurity profile is sharp. In the fourth embodiment, the gradient of impurity profile is sharper at an interface between low concentration drain region 15b and high concentration drain region 19b than that between channel region 11 and low concentration drain region 15b, and hence, nitrided oxide film 5b is formed at the position shown in FIG. 25. If drain is of LDD structure, a lateral electric field is reduced, thereby suppressing impact ionization. Accordingly, the drain of LDD structure is more resistive to hot carriers than a single drain.

Figure 26:
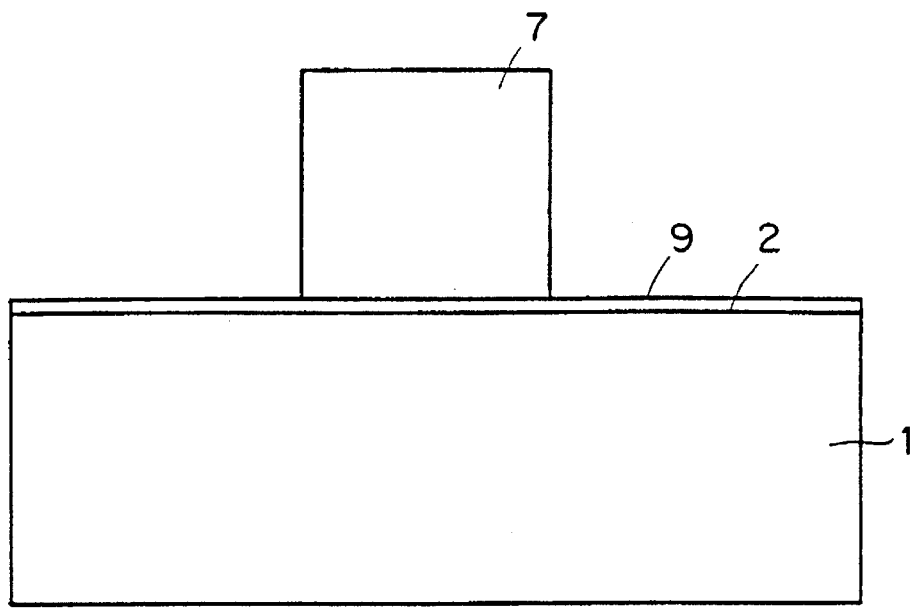
FIGS. 26–29 are cross-sectional views showing, respectively, first, second, third and fourth steps of a manufacturing method of the fourth embodiment of the field effect transistor according to the present invention.

A description will now be made on a method of manufacturing the field effect transistor of the fourth embodiment according to the present invention shown in FIG. 25. As shown in FIG. 26, a silicon oxide film 9 of approximately 70 Å in thickness is formed on a main surface 2 of a silicon substrate 1. A polycrystalline silicon film of 2000–4000 Å in thickness is then formed on silicon oxide film 9. A gate electrode 7 is formed by employing photolithography and etching technique. A gate length is set to 0.3 μm.

Figure 27:
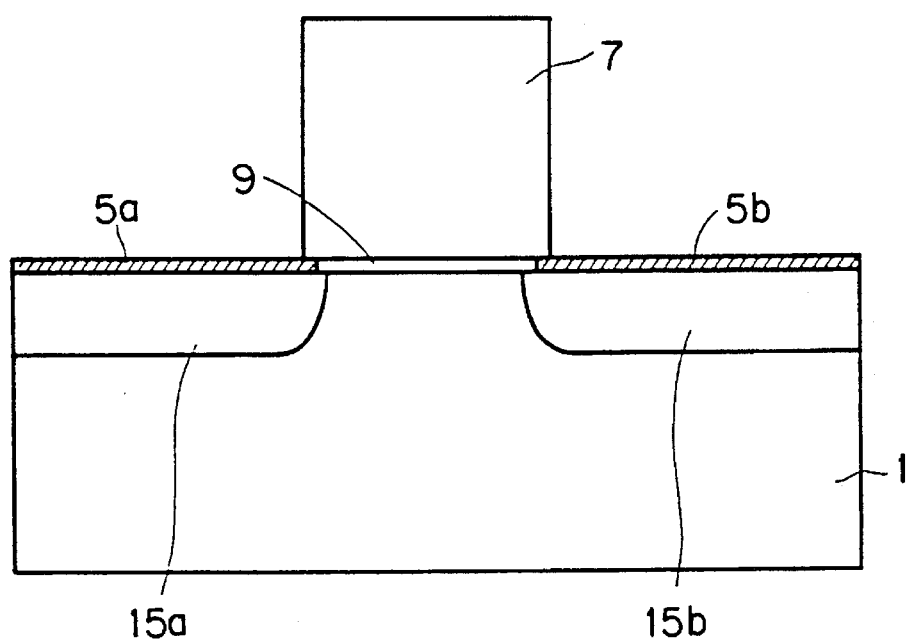

Then, as shown in FIG. 27, silicon oxide film 9 is subjected to lamp annealing in an ammonium atmosphere at e.g., 900° C. for 30–60 seconds. Annealed silicon oxide film 9 is then nitrided. Then, the nitrided silicon oxide film is re-oxidized in an oxygen atmosphere at, e.g., 1000° C. for 20–120 seconds, thereby forming nitrided oxide films 5a and 5b. Although nitrogen enters also into gate electrode 7, a nitrided layer is not formed. A nitrogen concentration in nitrided oxide films 5a and 5b can be controlled depending on a concentration in an ammonium atmosphere or re-oxidation time. When a gas for nitridation is $N_2O$, since no hydrogen is contained in the gas, re-oxidation is unnecessary.

Then, with gate electrode 7 used as a mask, silicon substrate 1 is implanted with, e.g., arsenic of $1\times10^{13}$ to $2\times10^{14}/cm^3$ at 30–70 keV, whereby a low concentration source region 15a and a low concentration drain region 15b are formed. Low concentration source region 15a and low concentration drain region 15b may be formed prior to formation of nitrided oxide films 5a and 5b.

Figure 28:
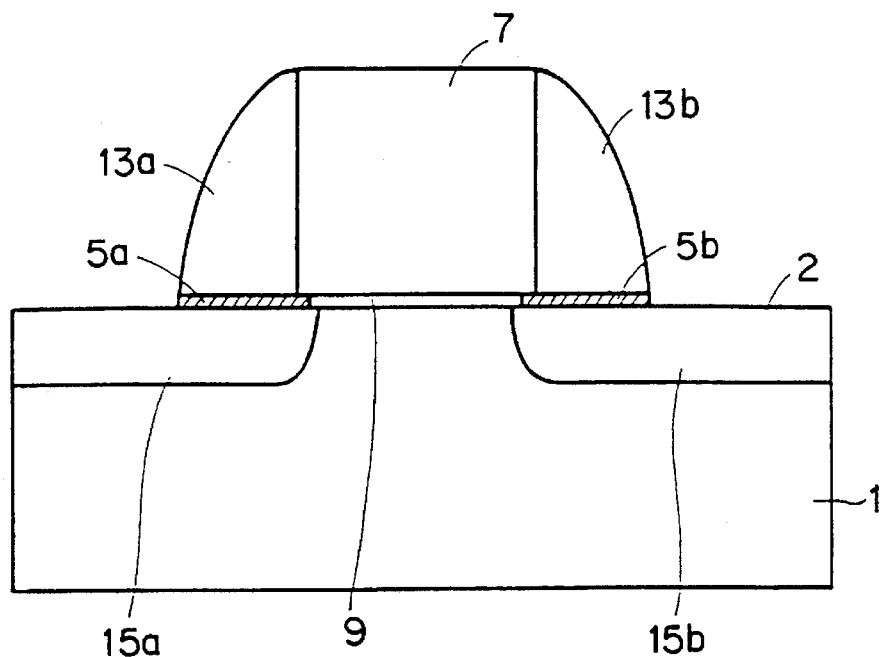

As shown in FIG. 28, a silicon oxide film of 500–3000 Å in thickness is formed on main surface 2. The silicon oxide film is then etched by anisotropic etching, thereby forming sidewall insulator films 13a and 13b.

Figure 29:
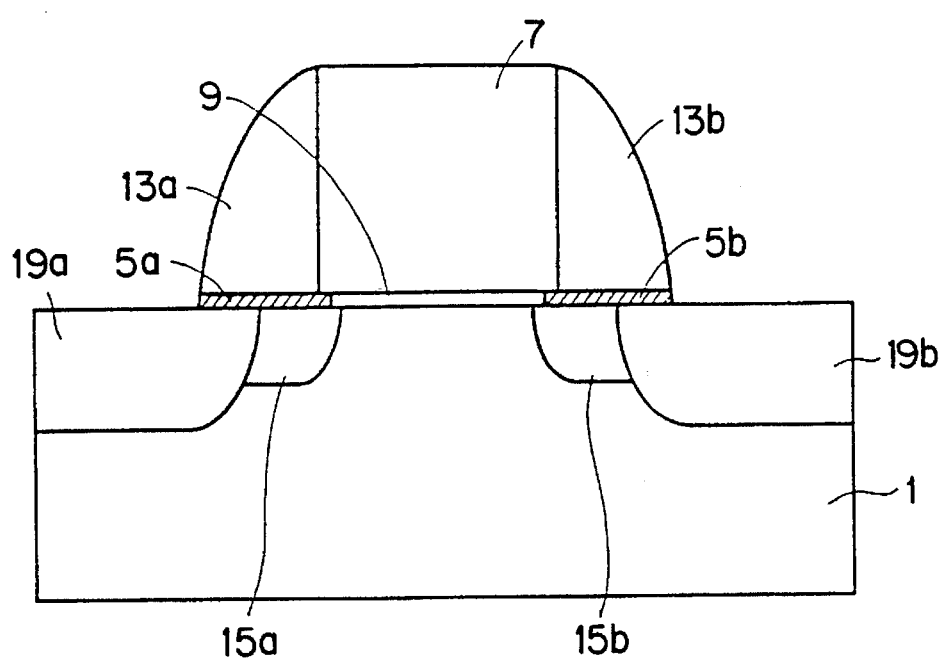

As shown in FIG. 29, with gate electrode 7 and sidewall insulator films 13a and 13b used as masks, silicon substrate 1 is implanted with arsenic of $1\times10^{15}/cm^2$ or more at an acceleration energy of 40–70 keV. Annealing the resultant film results in formation of a high concentration source region 19a and a high concentration drain region 19b.

A fifth embodiment

Figure 30:
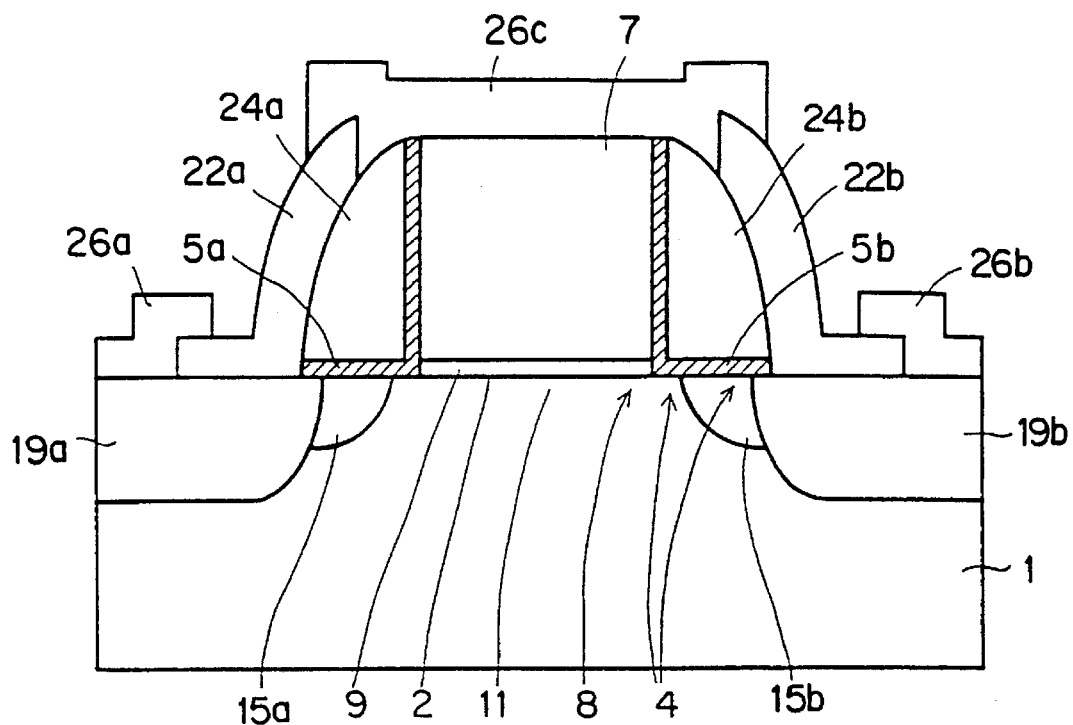
FIG. 30 is a schematic cross-sectional view of a fifth embodiment of a field effect transistor in accordance with the present invention.

FIG. 30 is a schematic cross-sectional view of a fifth embodiment of a field effect transistor in accordance with the present invention. Constituent members identical to those of the field effect transistor of FIG. 25 are denoted with identical reference numerals. When the gradient of impurity concentration is sharper at an interface between channel region 11 and low concentration drain region 15b than that between low concentration drain region 15b and high concentration drain region 19b, drain avalanche hot carriers are generated at the interface between low concentration drain region 15b and channel region 11. Thus, in this case, a nitrided oxide film must be formed on main surface 2 on the interface between low concentration drain region 15b and channel region 11. The fifth embodiment provides a field effect transistor of such structure.

Sidewall conductive films made of polycrystalline silicon are denoted with reference characters 24a and 24b. Sidewall conductive films 24a and 24b and gate electrode 7 are connected by a polycrystalline silicon film 26c. Thus, sidewall conductive films 24a and 24b also serve as gate electrode 7. This is because a channel for connecting low concentration source region 15a and low concentration drain region 15b cannot be formed only by gate electrode 7.

Silicon oxide films 22a and 22b are formed in order to insulate sidewall conductive films 24a and 24b from high concentration source region 19a and high concentration drain region 19b. Reference characters 26a and 26b denote polycrystalline silicon films. A description will now be made on a method of manufacturing the field effect transistor of the fifth embodiment according to the present invention.

Figure 31:
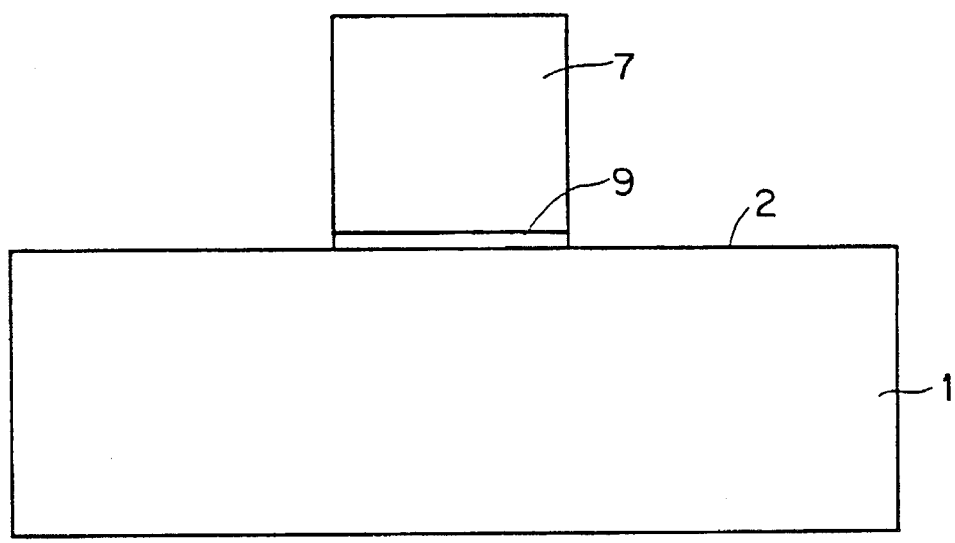
FIGS. 31–38 are cross-sectional views showing, respectively, first, second, third, fourth, fifth, sixth, seventh and eighth steps of a manufacturing method of the fifth embodiment of the field effect transistor according to the present invention.
Figure 32:
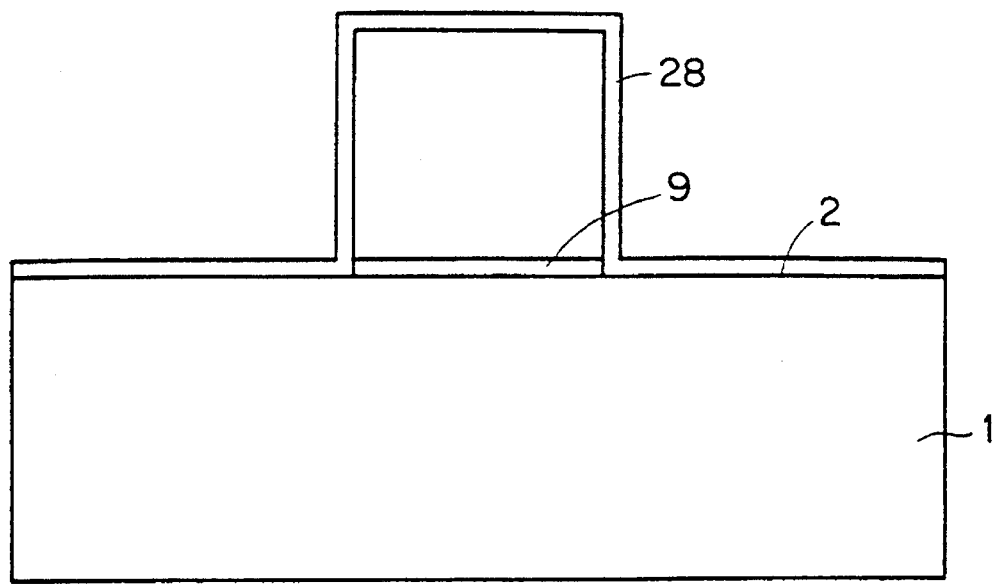

As shown in FIG. 31, a silicon oxide film 9 and a gate electrode 7 are formed in turn on a main surface 2 of a silicon substrate 1. Referring to FIG. 32, a silicon oxide film 28 of 100 Å, for example, is formed on main surface 2 by employing a low pressure CVD.

Figure 33:
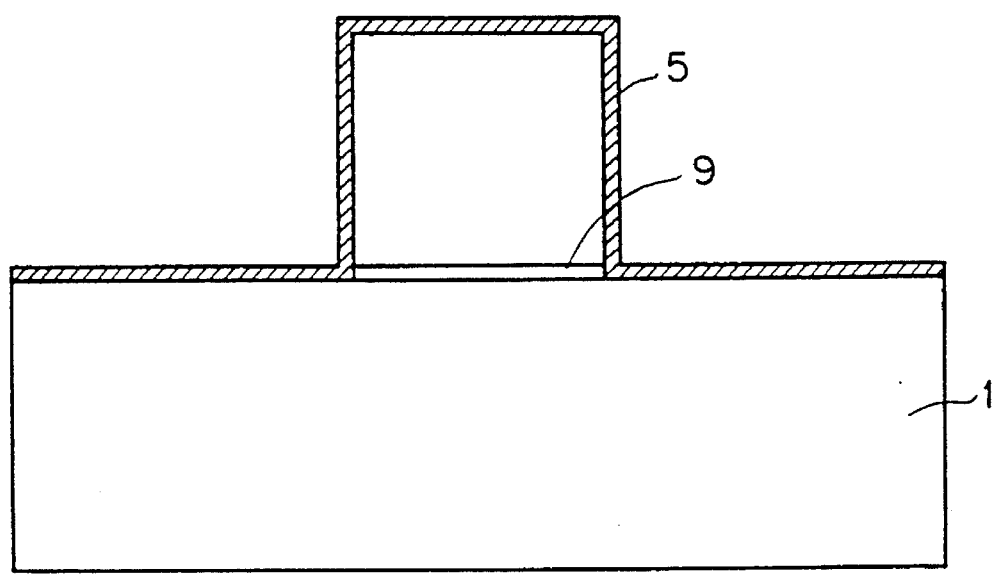
Figure 34:
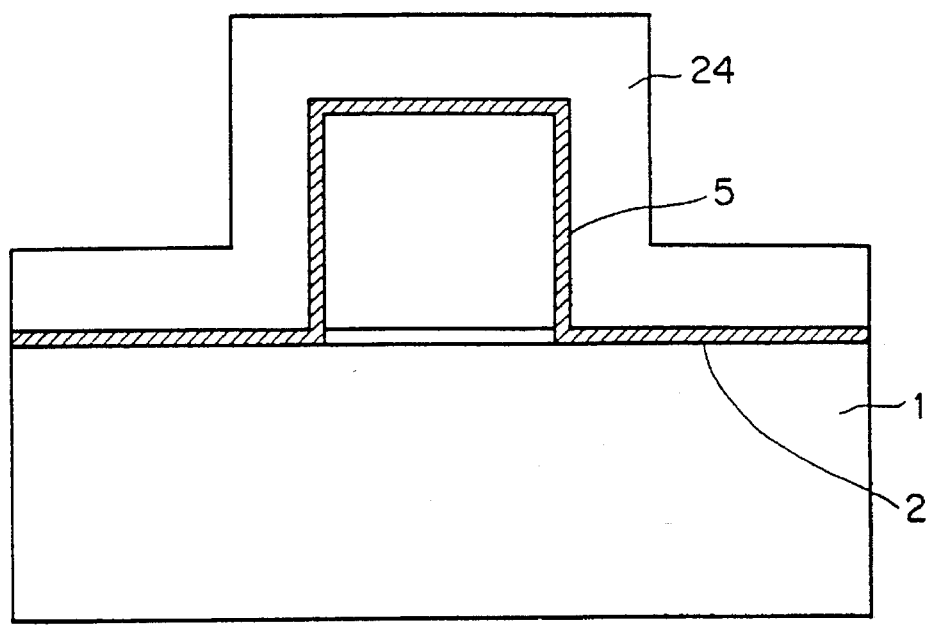

As shown in FIG. 33, silicon oxide film 28 is subjected to nitridation in a pure ammonium atmosphere at, e.g., 950° C. for 30 seconds. Further, the nitrided silicon oxide film is subjected to re-oxidation in an oxygen atmosphere at, e.g., 1000° C. for approximately 30 seconds. This causes silicon oxide film 28 to be a nitrided oxide film 5. As shown in FIG. 34, an n type polycrystalline silicon film 24, for example, is formed on main surface 2. The thickness of polycrystalline silicon film 24 is set to 2000 Å.

Figure 35:
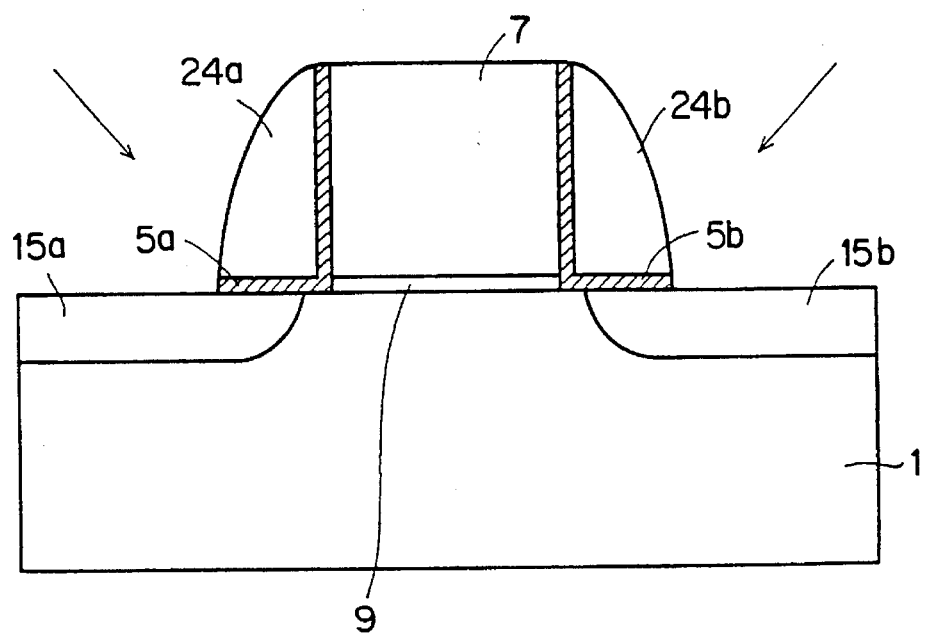

Referring to FIG. 35, polycrystalline silicon film 24 is etched, to form sidewall conductive films 24a and 24b. Then, n type impurities such as arsenic or phosphorus are implanted into silicon substrate 1 at an angle of e.g., 45° to main surface 2, thereby forming a low concentration source region 15a and a low concentration drain region 15b. A dose of impurities is set to $1\times10^{13}/cm^2$.

Figure 36:
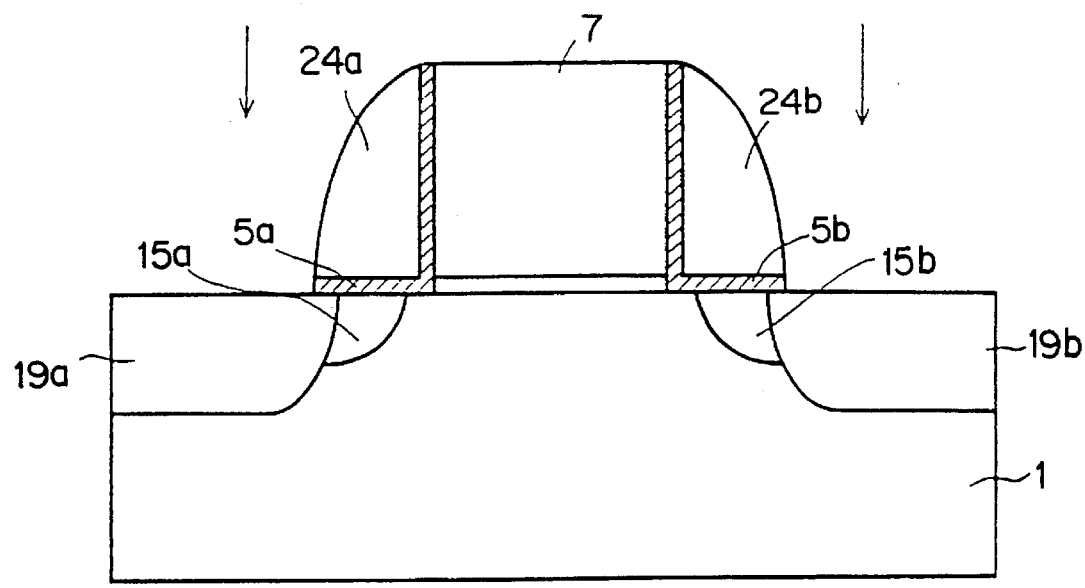

Referring to FIG. 36, silicon substrate 1 is implanted with arsenic of $1\times10^{15}/cm^2$ or more to form a high concentration source region 19a and a high concentration drain region 19b. Since impurities are implanted at an angle of 45° to main surface 2 in the formation of low concentration source region 15a and drain region 15b, low concentration source region 15a and low concentration drain region 15b are formed inside high concentration source region 19a and high concentration drain region 19b, respectively.

Figure 37:
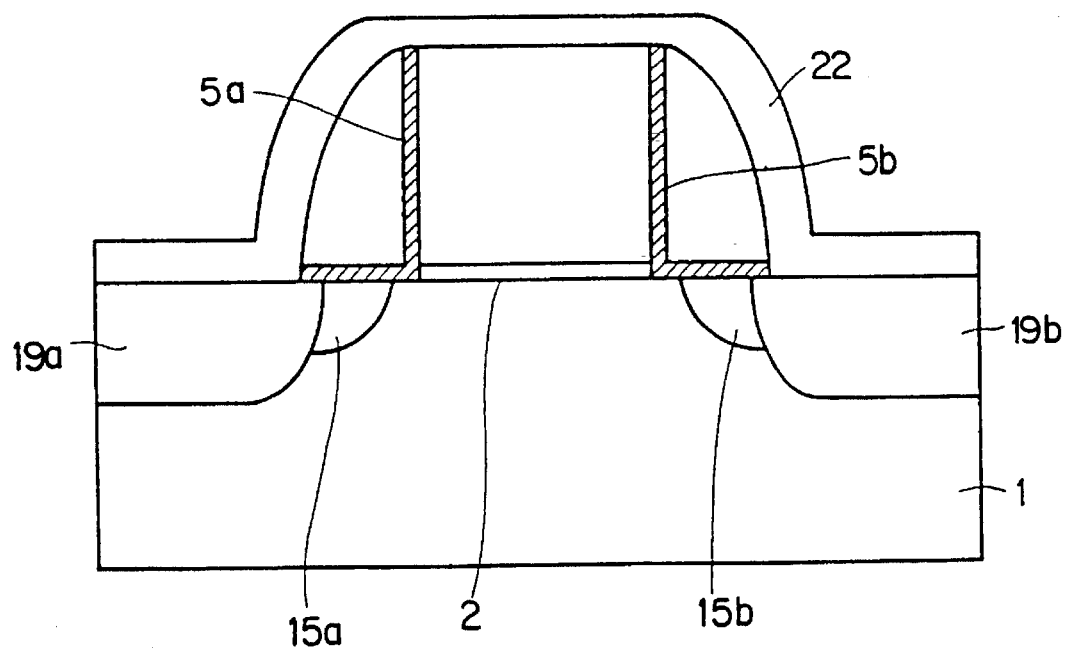

A silicon oxide film 22 is formed on main surface 2 as shown in FIG. 37.

Figure 38:
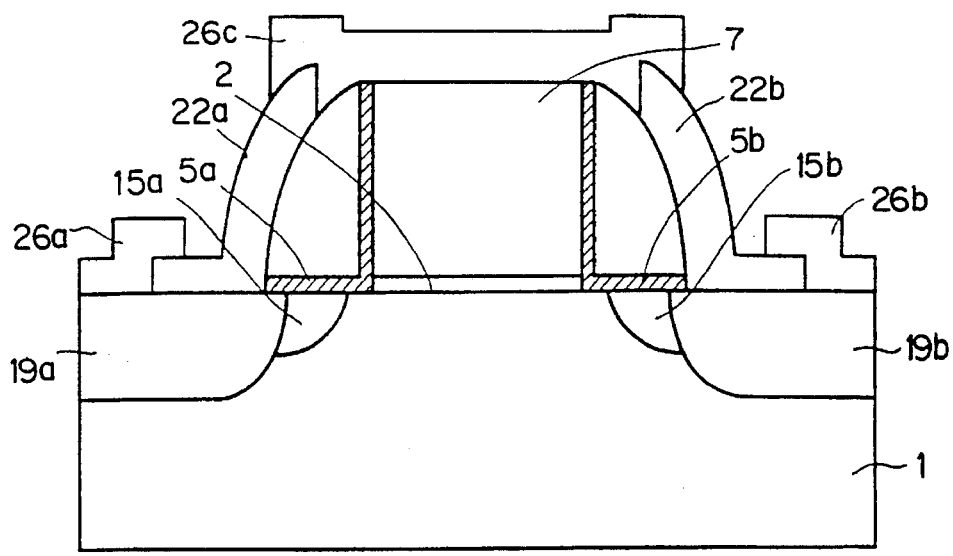

Referring to FIG. 38, silicon oxide film 22 is etched, thereby leaving only silicon oxide films 22a and 22b. A polycrystalline silicon film is formed on main surface 2. The polycrystalline silicon film is then subjected to a predetermined patterning to form polycrystalline silicon films 26a, 26b and 26c.

A sixth embodiment

Figure 39:
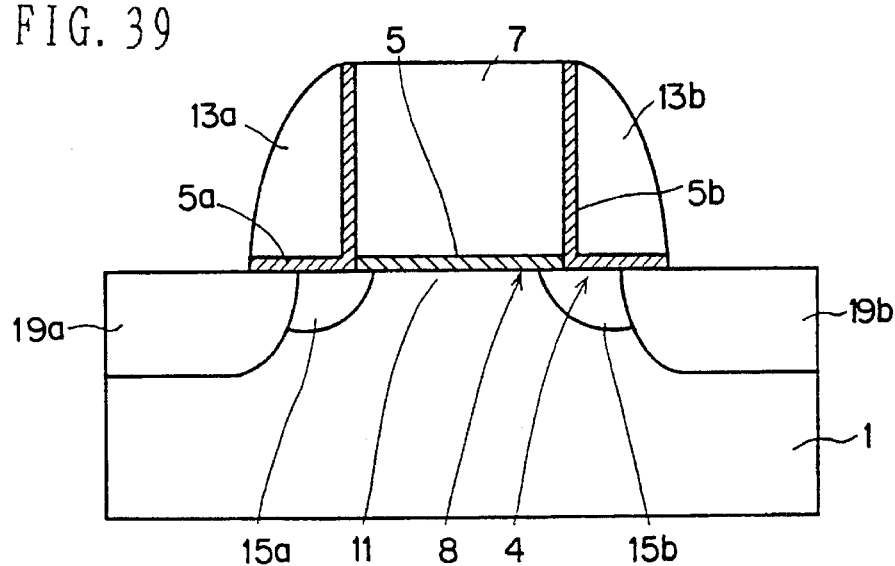
FIG. 39 is a schematic cross-sectional view of a sixth embodiment of a field effect transistor in accordance with the present invention.

FIG. 39 is a schematic cross-sectional view of a sixth embodiment of a field effect transistor in accordance with the present invention. Identical constituent members to those of the field effect transistor of FIG. 25 are denoted with identical reference numerals. A nitrided oxide film 5b is formed on a drain avalanche hot carrier injection region 4. A nitrided oxide film 5 is formed on a channel hot hole (electron) injection region 8. A nitrogen concentration in nitrided oxide film 5 is lower than that in nitrided oxide film 5b.

Figure 48:
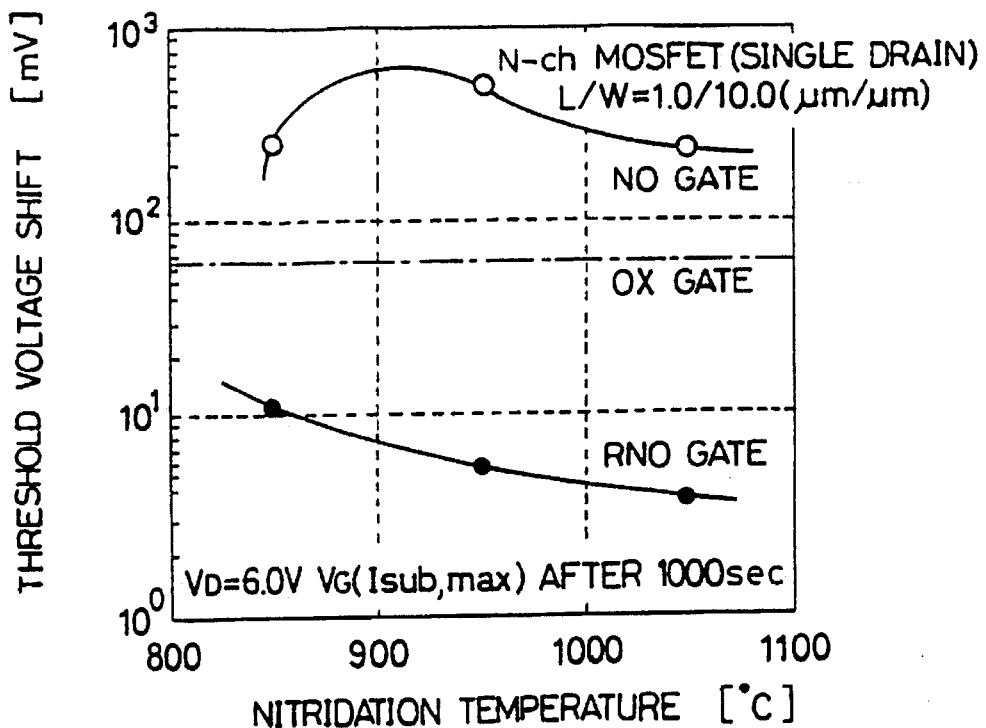
FIG. 48 is a graph showing the relationship between nitridation temperature and threshold voltage shift on condition that drain avalanche hot carriers are generated.

A description will now be given on a phenomenon that with a higher nitrogen concentration in the nitrided oxide film, a drain avalanche hot carrier resistivity improves. FIG. 48 is a graph presented in the aforementioned article by the inventor of the present application. The lateral axis indicates nitridation temperature in formation of films. The longitudinal axis indicates $V_{th}$ shift after stresses are applied. As the shift of $V_{th}$ is smaller, the resistivity to drain avalanche hot carriers is higher. Stresses are condition that drain avalanche hot carriers are generated at a drain voltage of 6.0 V. Time is 1000 seconds. RNO is a nitrided oxide film. OX is a silicon oxide film. NO is a film which is only nitrided not re-oxidized.

As can be seen from FIG. 48, as nitridation temperature increases, the $V_{th}$ shift for RNO decreases. When the same nitridation time is provided, as nitridation temperature increases, a nitrogen concentration in the film increases. Accordingly, as the nitrogen concentration in the RNO film is higher, the $V_{th}$ shift is smaller.

Figure 49:
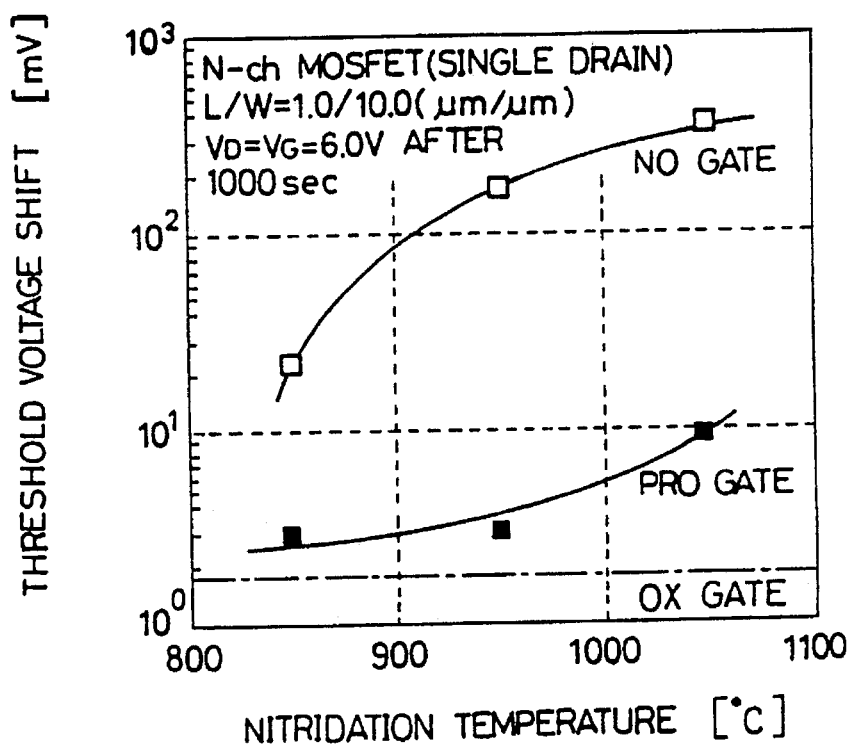
FIG. 49 is a graph showing the relationship between nitridation temperature and threshold voltage shift on condition that channel hot electrons are generated.

A description will now be made on a phenomenon that with a lower nitrogen concentration in the nitrided oxide film, a channel hot hole (electron) resistivity increases. FIG. 49 is a graph presented in the aforementioned article by the inventor of the present application. In this case, stresses are on condition that both a drain voltage and gate voltage are set to 6.0 V. Channel hot electrons are generated on such condition. Time is set to 1000 seconds. As can be seen from FIG. 49, with regard to RNO, nitridation time is shorter, the $V_{th}$ shift is smaller. Since the nitridation temperature is in proportion to the nitrogen concentration in the nitrided oxide film, as nitridation temperature decreases, the nitrogen concentration in the nitrided oxide film decreases. Thus, as the nitrogen concentration in the nitrided oxide film decreases, the $V_{th}$ shift decreases.

Figure 50:
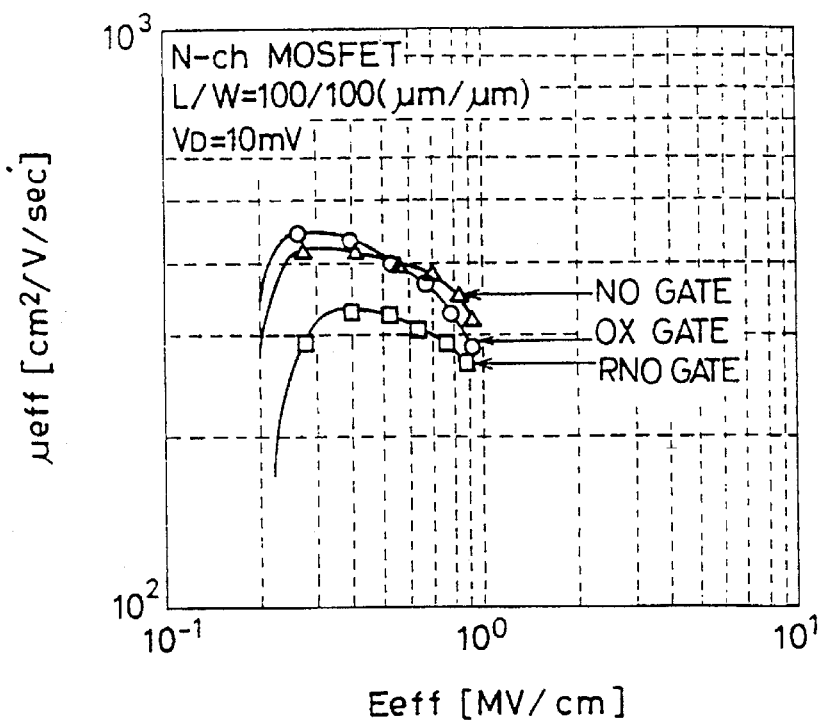
FIG. 50 is a graph showing the relationship between $E_{eff}$ and $\mu_{eff}$ in each case of NO, OX and RNO gate insulator films.
Figure 51:
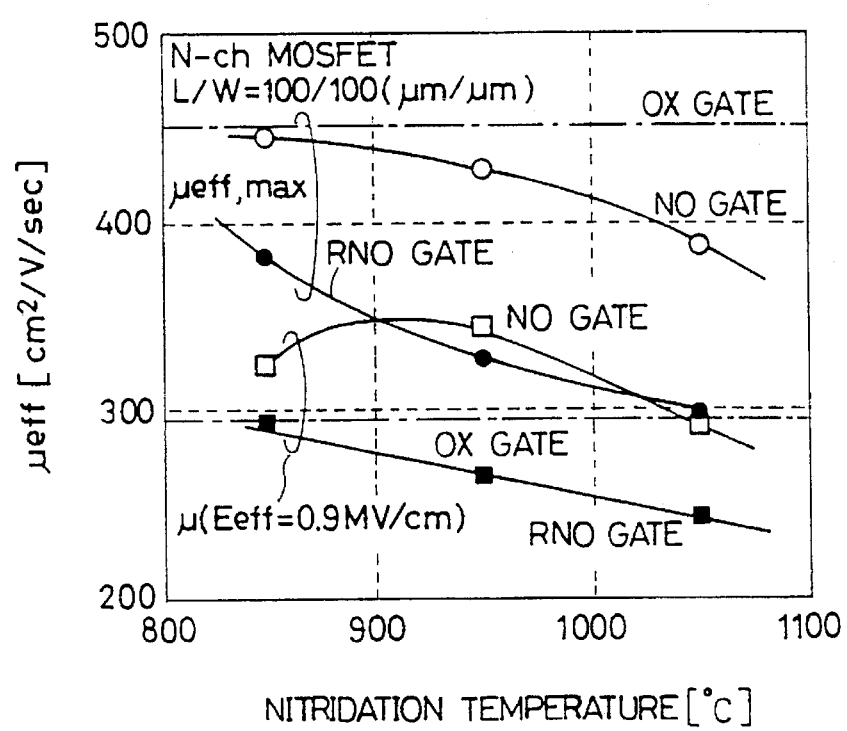
FIG. 51 is a graph showing the relationship between nitridation temperature and $\mu_{eff}$ in each case of NO, OX and RNO gate insulator films.

In the sixth embodiment of the field effect transistor according to the present invention, since the nitrided oxide film is employed as a gate insulator film, a channel hot hole (electron) resistivity and a current handling capability at a low gate voltage are deteriorated as compared to a field effect transistor employing a silicon oxide film as the gate insulator film. However, as can be understood from FIG. 49, if nitridation temperature is set to 900° C. or less in formation of nitrided oxide film 5, then the channel hot hole (electron) resistivity is approximately the same as that in the case with the field effect transistor using the silicon oxide film as the gate insulator film. The value of the current handling capability at a low gate voltage in the case with a field effect transistor employing a silicon nitride film as a gate insulator film approaches the value of the current handling capability at a low gate voltage in the case with the field effect transistor using the silicon oxide film as the gate insulator film. Reasons for this will be described with reference to FIGS. 50 and 51. FIGS. 50 and 51 are graphs disclosed in the aforementioned article by the inventor of the present application.

A description will now be made on FIG. 50. $E_{eff}$ is an effective field. The effective field is an electric field in a longitudinal direction of a channel. If the value of a gate voltage decreases, the effective field decreases. $\mu_{eff}$ is inversion layer mobility. The inversion layer mobility is a rate at which carriers move in an inversion layer. If the inversion layer mobility is larger, the current handling capability is larger. As can be seen from FIG. 50, when the effective field is 0.3, i.e., a low electric field, the value of $\mu_{eff}$ is a maximum value.

FIG. 51 will now be described. A lateral axis is nitridation temperature in formation of films. A longitudinal axis is inversion layer mobility. $\mu_{eff}$, max is a maximum value of $\mu_{eff}$. As shown in FIG. 50, when the value of $E_{eff}$ is 0.3, $\mu_{eff}$ is maximum. $\mu_{eff}$, max for OX and that for RNO become close to each other as nitridation temperature decreases. Thus, if a nitrided oxide film is formed at a nitridation temperature of 900° C. or less, then the current handling capability of the field effect transistor at a low gate voltage becomes close to that of the field effect transistor using a silicon oxide film as the gate insulator film. Time is preferably 5-30 seconds when nitridation is carried out in an ammonium atmosphere at 900° C. or less. This is because if nitridation time is over 30 seconds, nitridation temperature is raised. If nitridation time is shorter than 5 seconds, sufficient nitridation is not carried out.

Figure 40:
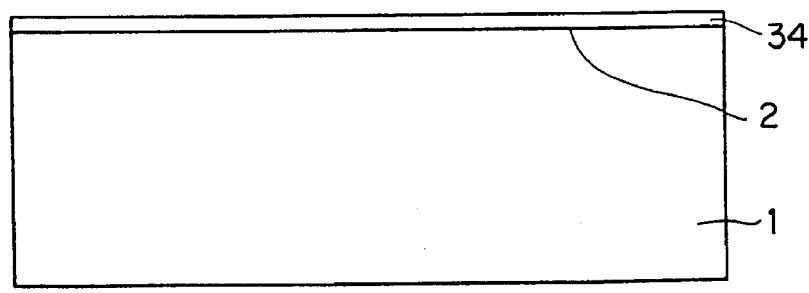
FIGS. 40–47 are cross-sectional views showing, respectively, first, second, third, fourth, fifth, sixth, seventh and eighth steps of a manufacturing method of the sixth embodiment of the field effect transistor according to the present invention.
Figure 41:
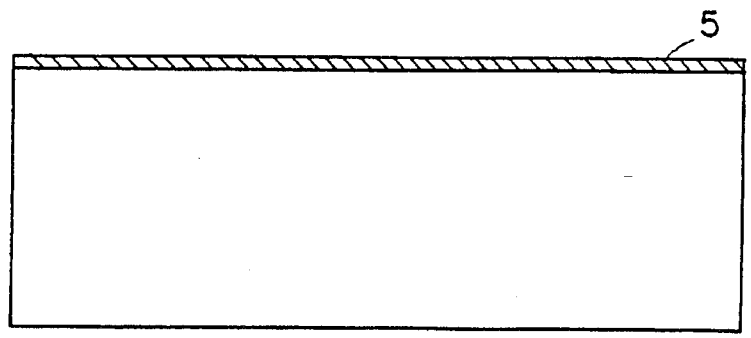

A description will now be made on a method of manufacturing the field effect transistor of the sixth embodiment according to the present invention. As shown in FIG. 40, a silicon substrate 1 is subjected to thermal oxidation at a hydrogen atmosphere at 850° C., whereby a silicon oxide film 34 of 100 Å in thickness is formed on a main surface 2. Silicon oxide film 34 is then exposed to a pure ammonium atmosphere at 900° C. or less for 30 seconds or less. After that, annealing or re-oxidation is carried out at a temperature of approximately 1000° C., thereby forming a nitrided oxide film 5 shown in FIG. 41.

Figure 42:
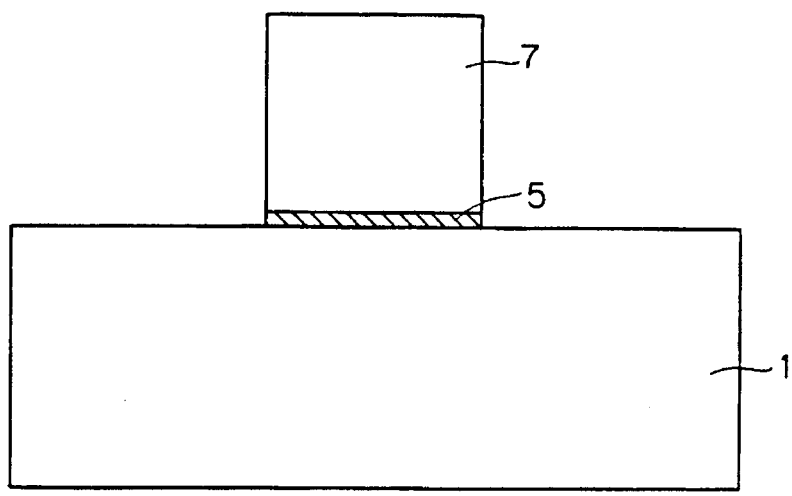
Figure 43:
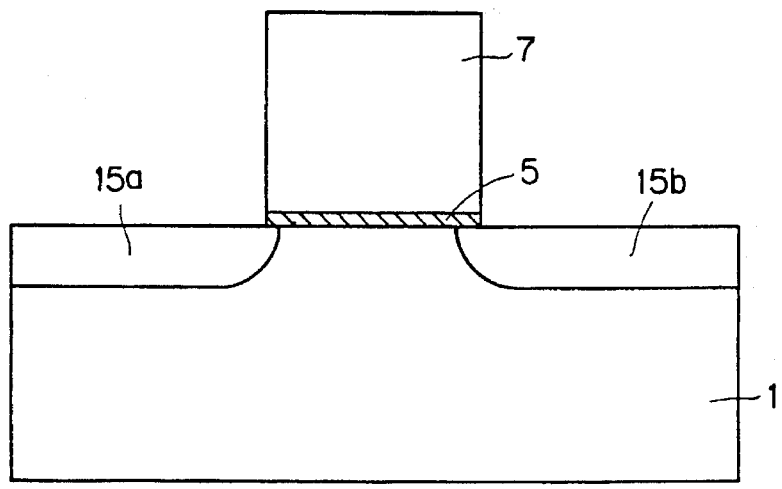

Polycrystalline silicon is formed on nitrided oxide film 5, and the polycrystalline silicon and nitrided oxide film 5 are subjected to a predetermined patterning, whereby a gate electrode 7 shown in FIG. 42 is formed. As shown in FIG. 43, silicon substrate 1 is ion-implanted with phosphorus or arsenic, thereby forming a low concentration source region 15a and a low concentration drain region 15b. A dose is set to $1 \times 10^{13}/cm^2$.

Figure 44:
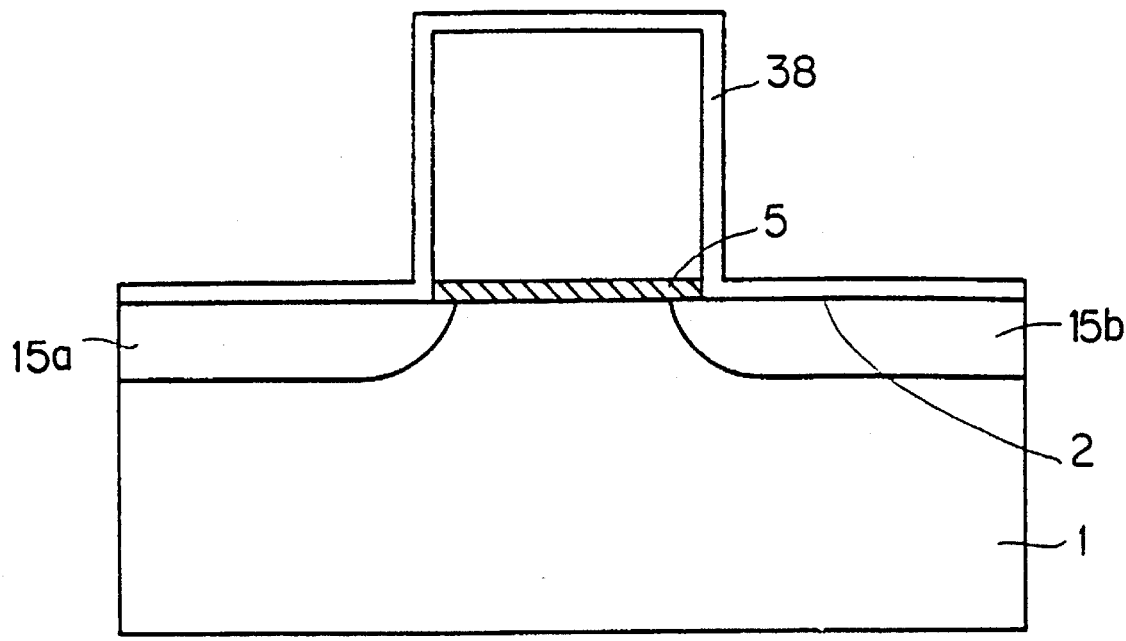
Figure 45:
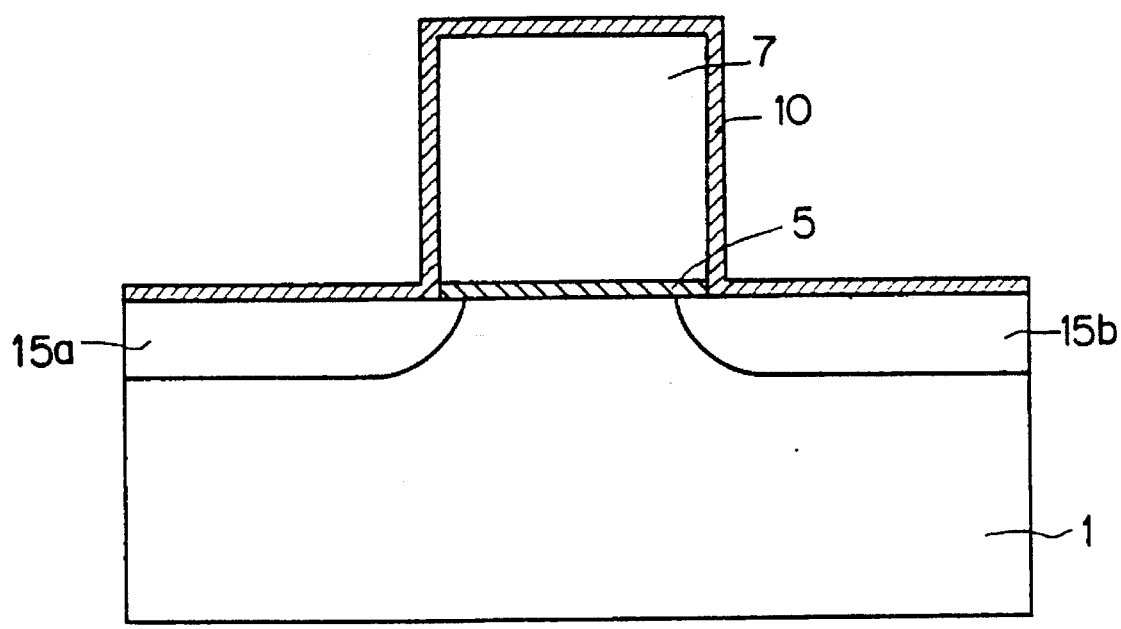

As shown in FIG. 44, a silicon oxide film 38 of 100 Å in thickness is formed on main surface 2 by a low pressure CVD method. Silicon oxide film 38 is then exposed in a pure ammonium atmosphere at 950° C. or more for 30 seconds or more. After that, the resultant film is annealed or re-oxidized at a temperature of approximately 1000° C., thereby forming a nitrided oxide film 10 as shown in FIG. 45.

Figure 46:
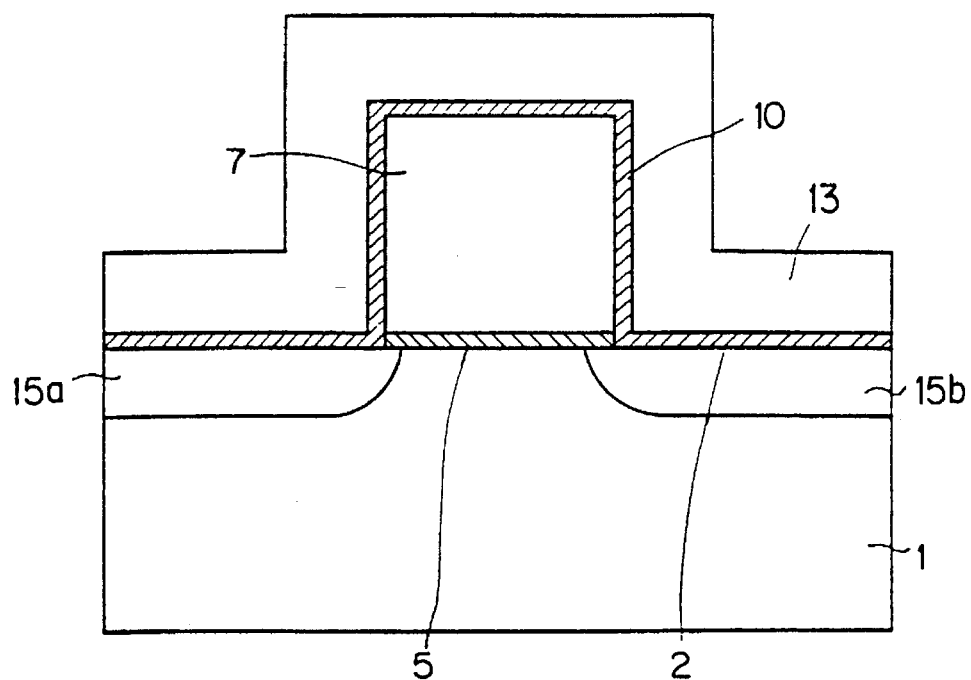
Figure 47:
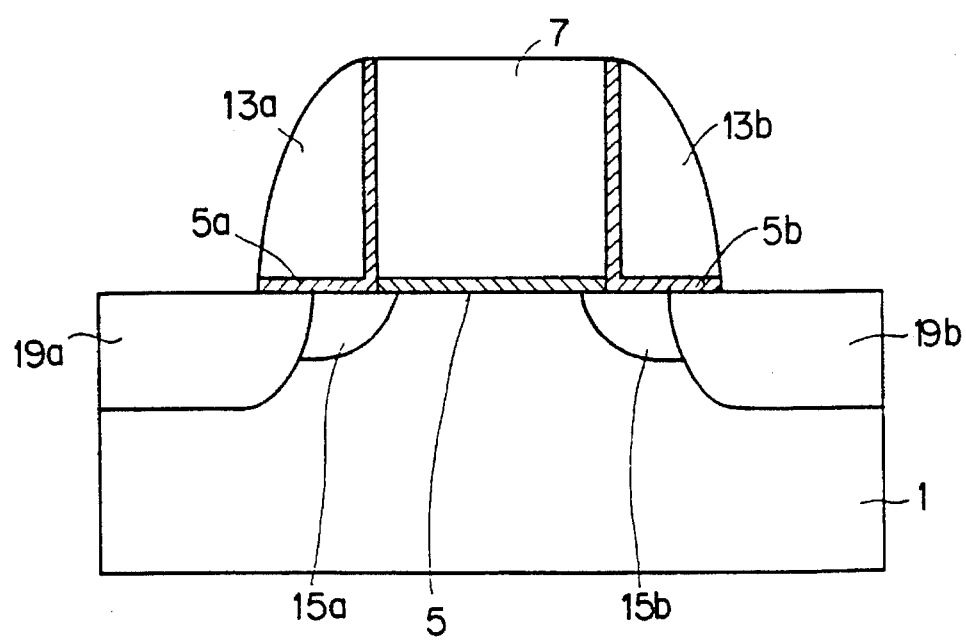

As shown in FIG. 46, a silicon oxide film 13 of 2000 Å in thickness is formed on main surface 2. Referring to FIG. 47, silicon oxide film 13 and nitrided oxide film 10 are subjected to anisotropic etching, whereby sidewall insulator films 13a and 13b and nitrided oxide films 5a and 5b are formed. Then, with gate electrode 7 and sidewall insulator films 13a and 13b used as masks, silicon substrate 1 is ion-implanted with arsenic, thereby forming a high concentration source region 19a and a high concentration drain region 19b. A dose is set to $1 \times 10^{15}/cm^2$.

A seventh embodiment

Figure 52:
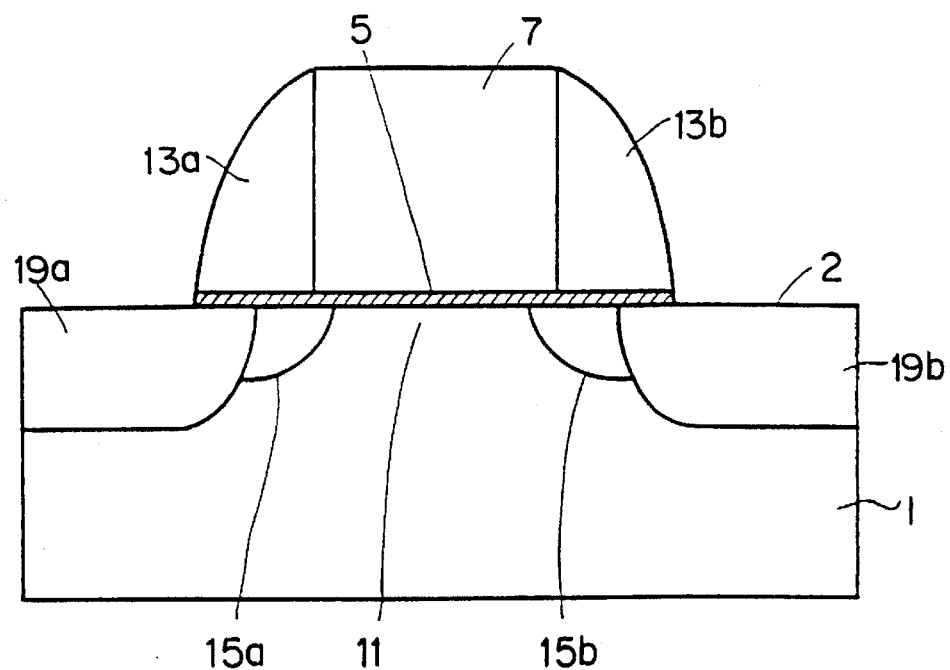
FIG. 52 is a schematic cross-sectional view of a seventh embodiment of a field effect transistor in accordance with the present invention.

FIG. 52 is a schematic cross-sectional view of a seventh embodiment of a field effect transistor according to the present invention. Identical constituent members to those of the transistor of FIG. 25 are denoted with identical reference numerals. Sidewall insulator films 13a and 13b and gate electrode 7 are formed on nitrided oxide film 5.

In the seventh embodiment, since underlying both the gate electrode and the sidewall insulation film is a nitrided oxide film, a resistivity to drain avalanche hot carriers becomes greatly improved.

While a region in which drain avalanche hot carriers are mainly injected is made a nitrided oxide film in the fourth embodiment shown in FIG. 25, an injection region extends to a certain extent. Accordingly, drain avalanche hot carrier injection sometimes occur even under the gate electrode. In order to prevent this injection, it is necessary to provide a nitrided oxide film also under the gate electrode. This problem can be solved in the seventh embodiment.

An eighth embodiment

Figure 53:
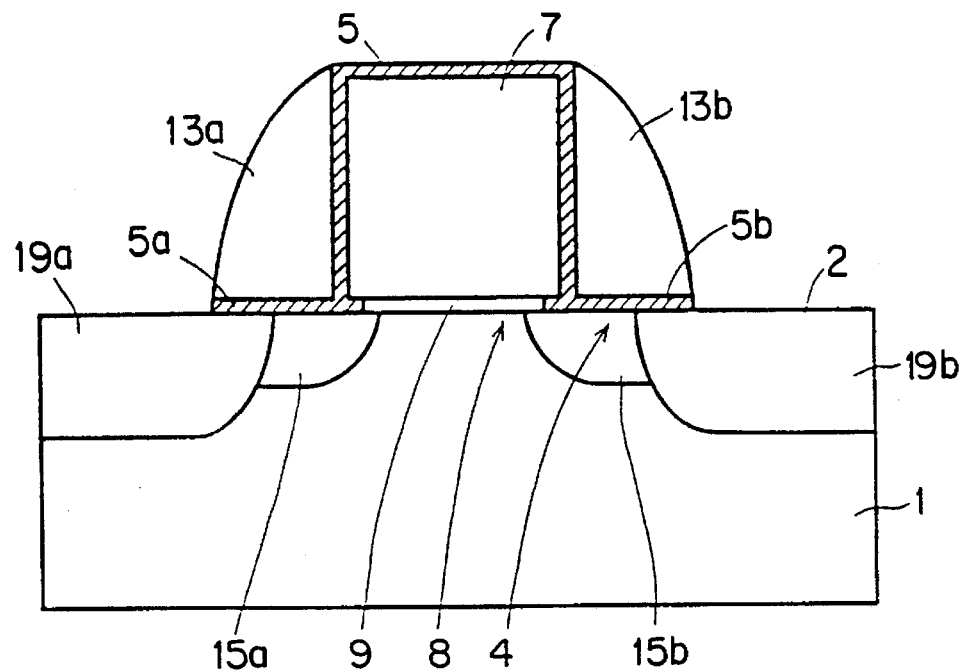
FIG. 53 is a schematic cross-sectional view of an eighth embodiment of a field effect transistor in accordance with the present invention.

FIG. 53 is a schematic cross-sectional view of an eighth embodiment of a field effect transistor according to the present invention. The same constituent members as those of the field effect transistor shown in FIG. 25 are denoted with the same reference numerals. In the fourth embodiment, as shown in FIG. 27, nitrided oxide films 5a and 5b are formed without removing the silicon oxide film formed beside gate electrode 7. In the eighth embodiment, a silicon oxide film is again formed on main surface 2 after removing the silicon oxide film beside gate electrode 7. The silicon oxide film thus newly formed is made to be nitrided oxide films 5a and 5b. Thus, in this embodiment, a nitrided oxide film 5 is formed on the surface of gate electrode 7.

The fourth embodiment of the present invention shown in FIG. 26 has the following problem. Silicon oxide film 9 formed beside gate electrode 7 is damaged by etching in the formation of gate electrode 7. If a nitrided oxide film is formed in such a state, the film has a higher interface state. This problem can be solved by the eighth embodiment.

A ninth embodiment

Figure 54:
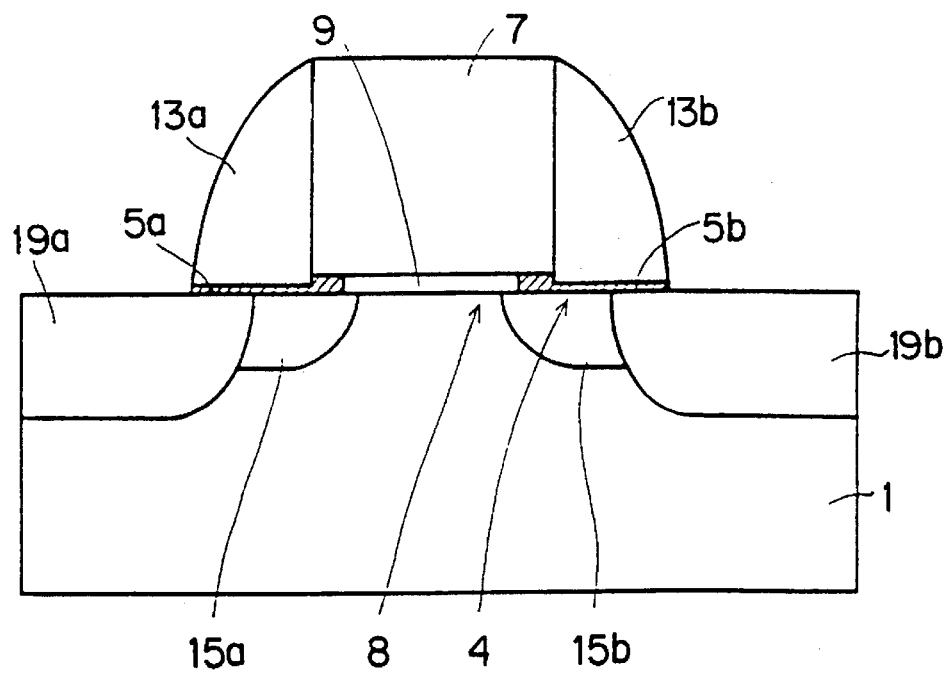
FIG. 54 is a schematic cross-sectional view of a ninth embodiment of a field effect transistor in accordance with the present invention.

FIG. 54 is a schematic cross-sectional view of a ninth embodiment of a field effect transistor according to the present invention. The same constituent members as those of the transistor shown in FIG. 25 are denoted with the same reference numerals. In the ninth embodiment, a silicon oxide film 9 beside gate electrode 7 in the state of FIG. 26 is etched to be a thin film. After that, silicon oxide film 9 beside gate electrode 7 is formed to be nitrided oxide films 5a and 5b. Forming the silicon oxide film beside gate electrode 7 to be a thin film makes it possible to shorten re-oxidation time or the like upon formation of nitrided oxide films. This makes it possible to prevent unnecessary diffusion of source regions and drain regions. In the eighth embodiment, the same effect can be accomplished even in the case where nitrided oxide films 5a and 5b are formed by employing a silicon oxide film which is thinner than silicon oxide film 9.

If the thickness of nitrided oxide films 5a and 5b is smaller than that of silicon oxide film 9 and materials of a higher permittivity such as silicon nitride film, $Ta_2O_5$, PZT (an alloy of lead, zirconium, and titanium) or the like are employed as the material of sidewall insulator films 13a and 13b, regions beneath sidewall insulator films 13a and 13b are also affected by gate electrode 7. This further enhances a current handling capability and hot carrier resistivity. This is disclosed in an article by Mizuno et al, entitled "High Dielectric LDD Spacer Technology for High Performance MOSFET", *IEDM* 89, p.613.

A tenth embodiment

Figure 55:
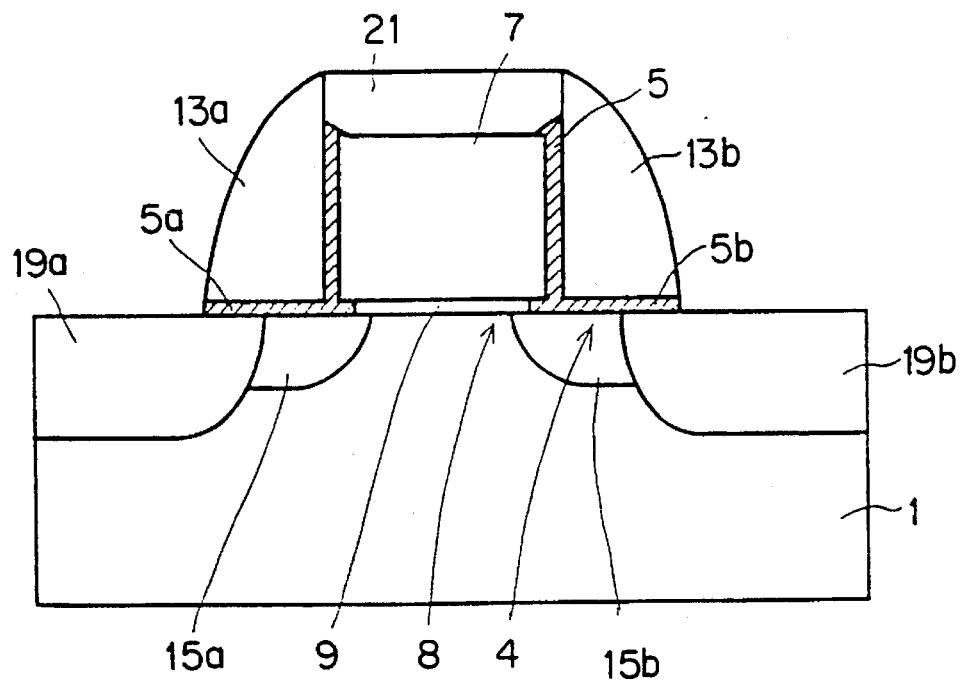
FIG. 55 is a schematic cross-sectional view of a tenth embodiment of a field effect transistor in accordance with the present invention.

FIG. 55 is a schematic cross-sectional view of a tenth embodiment of a field effect transistor according to the present invention. The same constituent members as those of the transistor shown in FIG. 25 are denoted with the same reference numerals. It is necessary to make steps of a lower insulator layer smaller in order to eliminate disconnection of an interconnection layer. In order to make the steps of the lower insulator layer smaller, the thickness of gate electrode 7 should be made smaller. If the thickness of gate electrode 7 is smaller, however, nitrogen might reach silicon oxide film 9 in formation of nitrided oxide films 5a and 5b. To avoid such a phenomenon, an anti-nitridation mask 21 is formed on gate electrode 7 in the tenth embodiment. As anti-nitridation mask 21, a silicon nitride film, silicon oxide film or the like may be used.

An eleventh embodiment

Figure 56:
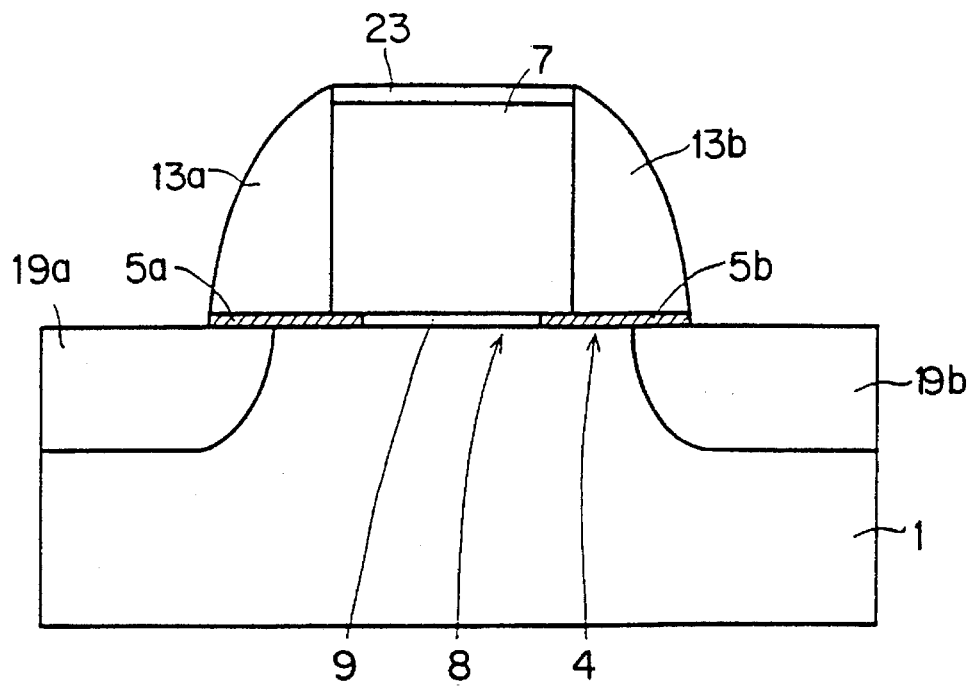
FIG. 56 is a schematic cross-sectional view of an eleventh embodiment of a field effect transistor in accordance with the present invention.

FIG. 56 is a schematic cross-sectional view of an eleventh embodiment of a field effect transistor according to the present invention. The same constituent members as those of the field effect transistor shown in FIG. 25 are denoted with the same reference numerals. If sidewall films 13a and 13b are made of such a conductive material as polycrystalline silicon, sidewall films 13a and 13b are also made to be a gate electrode. Thus, a channel is formed below nitrided oxide films 5a and 5b. This allows a low concentration source region and a low concentration drain region to be omitted. An etching stopper 23 is formed on gate electrode 7. Etching stopper 23 is formed when gate electrode 7 is liable to be etched in formation of sidewall films 13a and 13b. When sidewall films 13a and 13 b are made of polycrystalline silicon, etching stopper 23 is preferably made of a silicon oxide film.

A twelfth embodiment

Figure 57:
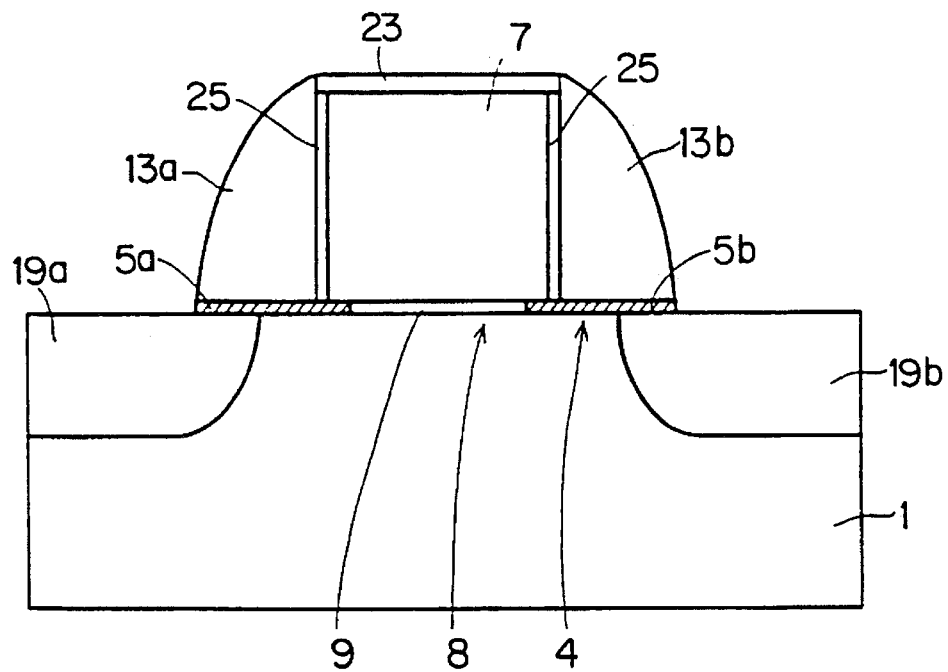
FIG. 57 is a schematic cross-sectional view of a twelfth embodiment of a field effect transistor in accordance with the present invention.

FIG. 57 is a schematic cross-sectional view of a twelfth embodiment of a field effect transistor according to the present invention. Sidewall films 13a and 13b are made of conductive materials. If silicon substrate 1 is exposed in the air after formation of gate electrode 7, a native oxide film 25 is formed beside gate electrode 7. If the thickness of native oxide film 25 is so small as to cause a tunnel effect, then sidewall films 13a and 13b can be formed without removing native oxide film 25. Since native oxide film 25 is so thin as to cause the tunnel effect, sidewall films 13a and 13b are also made to be a gate electrode.

A thirteenth embodiment

Figure 58:
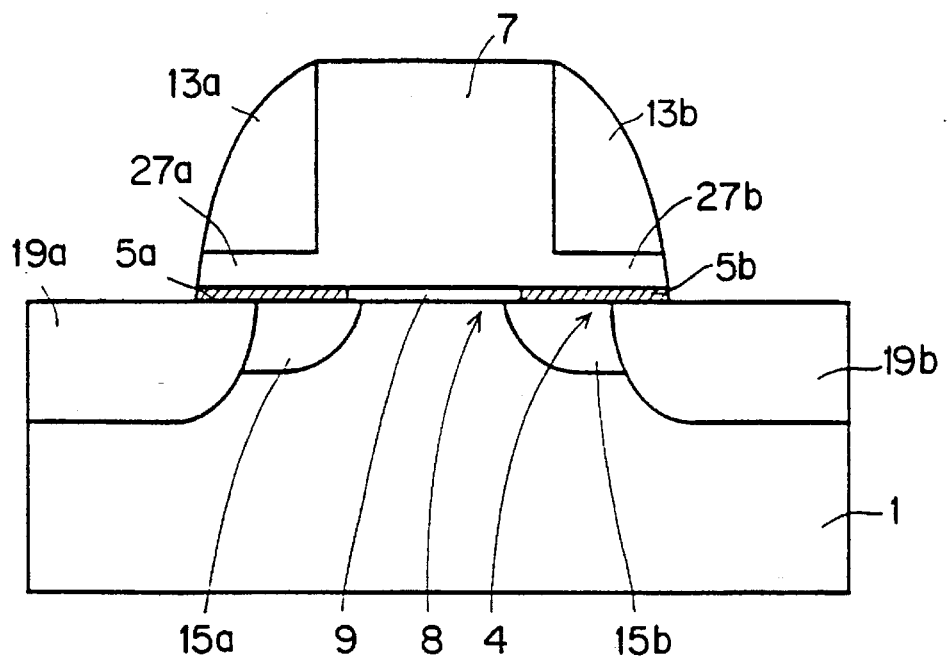
FIG. 58 is a schematic cross-sectional view of a thirteenth embodiment of a field effect transistor in accordance with the present invention.

FIG. 58 is a schematic cross-sectional view of a thirteenth embodiment of a field effect transistor according to the present invention. Identical constituent members to those of the field effect transistor shown in FIG. 25 are denoted with identical reference numerals. In this embodiment, side portions 27a and 27b of gate electrode 7 are made thinner and nitrogen is diffused with gate electrode 7 used as a mask, so that nitrided oxide films 5a and 5b are formed only beneath side portions 27a and 27b.

Figure 59:
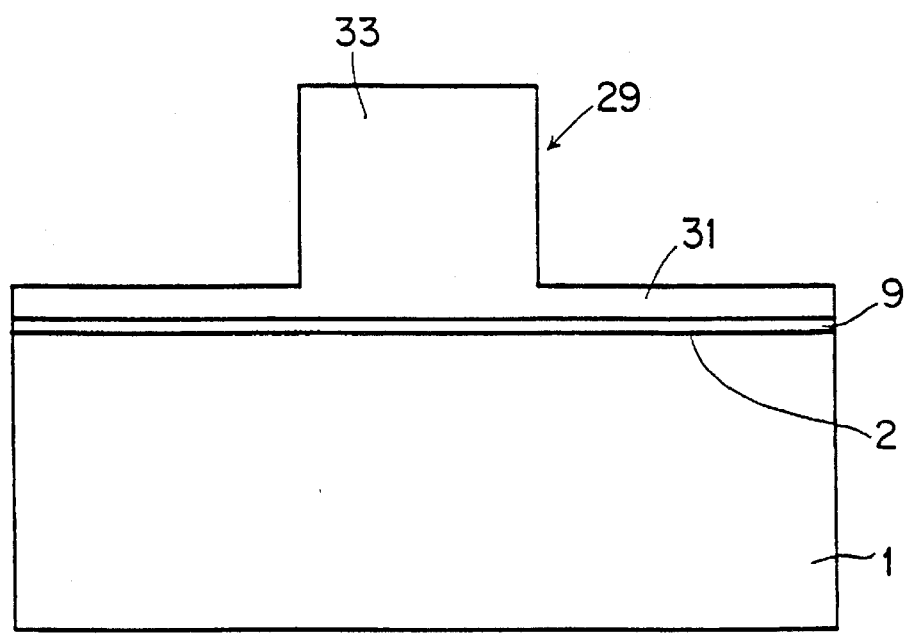
FIGS. 59–62 are cross-sectional views showing, respectively, first, second, third and fourth steps of a manufacturing method of the thirteenth embodiment of the field effect transistor according to the present invention.

A description will now be made on a method of manufacturing the field effect transistor of the thirteenth embodiment according to the present invention. As shown in FIG. 59, a silicon oxide film 9 of 70 Å in thickness is formed over the entire main surface 2 of a silicon substrate 1. Polycrystalline silicon 29 of 2000–4000 Å in thickness is then formed on silicon oxide film 9. Polycrystalline silicon 29 is processed as shown in FIG. 59 by employing photolithography and etching technology. The thickness of a thin portion 31 of polycrystalline silicon 29 is 500 Å or less, and the thickness of a thick portion 33 thereof is 2000–4000 Å.

Figure 60:
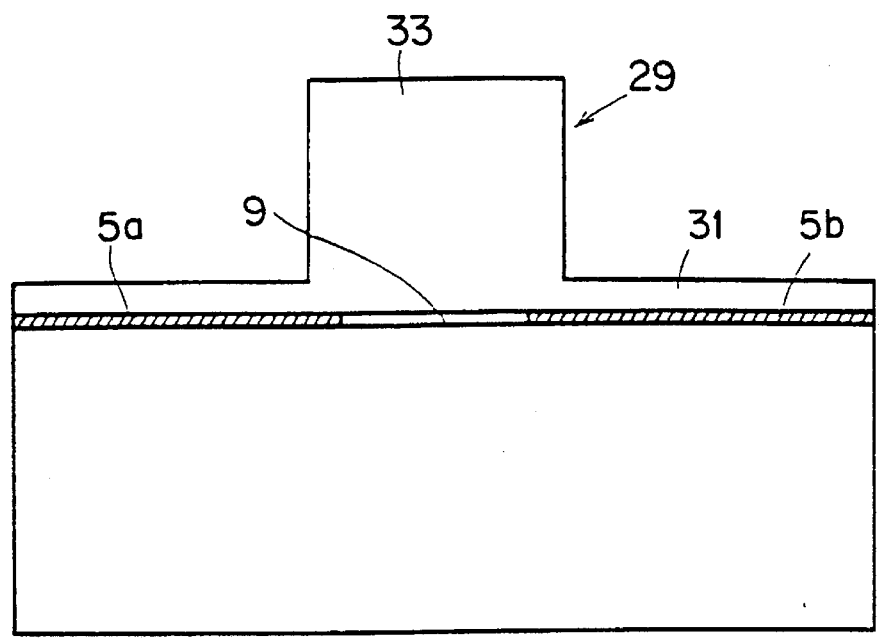
Figure 61:
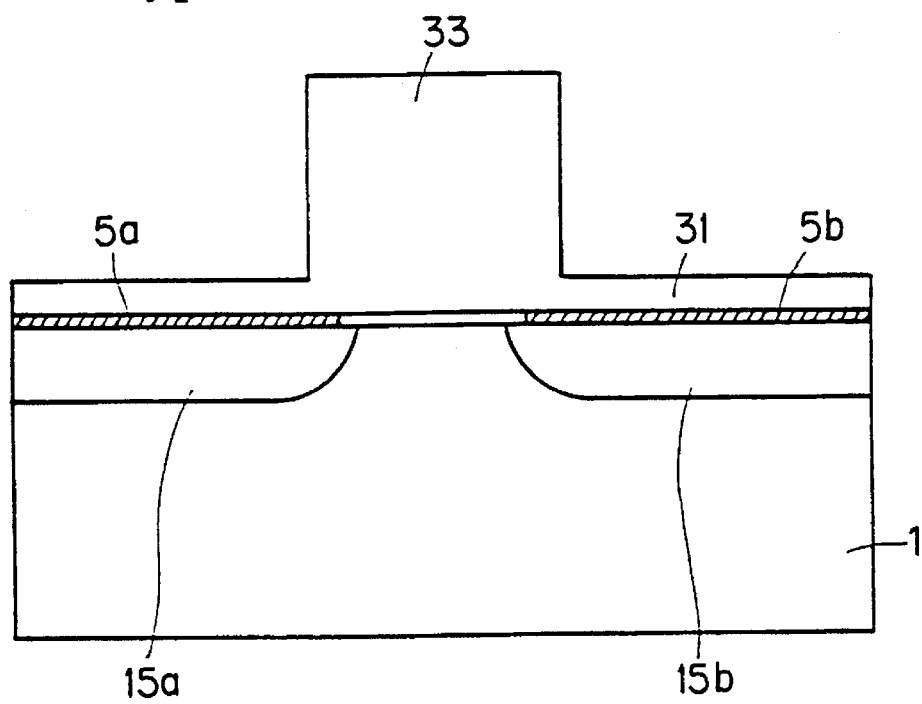

As shown in FIG. 60, with thick portion 33 of polycrystalline silicon 29 used as a mask, silicon oxide film 9 is nitrided and re-oxidized, to form nitrided oxide films 5a and 5b. Then, as shown in FIG. 61, with thick portion 33 used as a mask, silicon substrate 1 is ion-implanted, to form a low concentration source region 15a and a low concentration drain region 15b.

Figure 62:
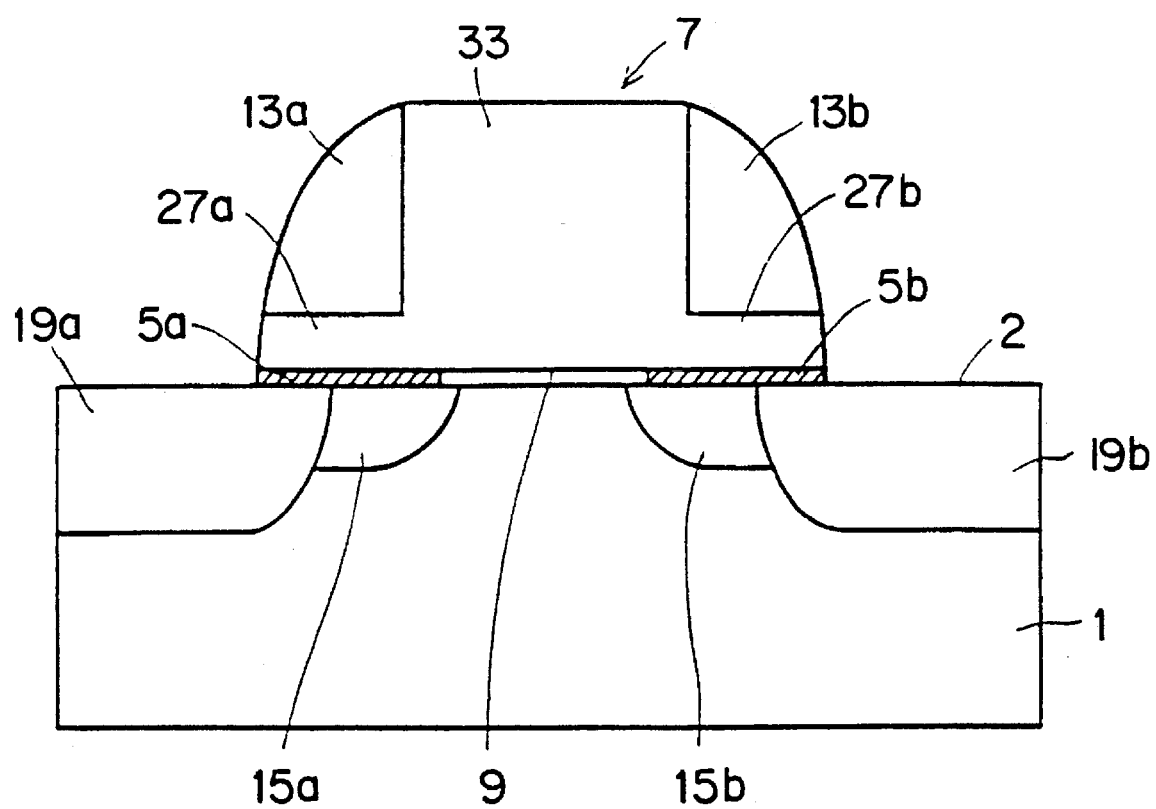

As shown in FIG. 62, a silicon oxide film of approximately 1000 Å in thickness is formed on an overall main surface 2 of silicon substrate 1. This silicon oxide film is etched by anisotropic etching, thereby forming sidewall insulator films 13a and 13b. Then, with sidewall insulator films 13a and 13b and thick portion 33 used as masks, a thin portion 31 of polycrystalline silicon 29 and nitrided oxide films 5a and 5b are etched to form gate electrode 7. Remaining thin portions 31 become side portions 27a and 27b of the gate electrode. Then, a high concentration source region 19a and a high concentration drain region 19b are formed by ion implantation. Since gate electrode 7 extends over high concentration source region 19a and high concentration drain region 19b, it is impossible to omit low concentration source region 15a or low concentration drain region 15b.

A fourteenth embodiment

Figure 63:
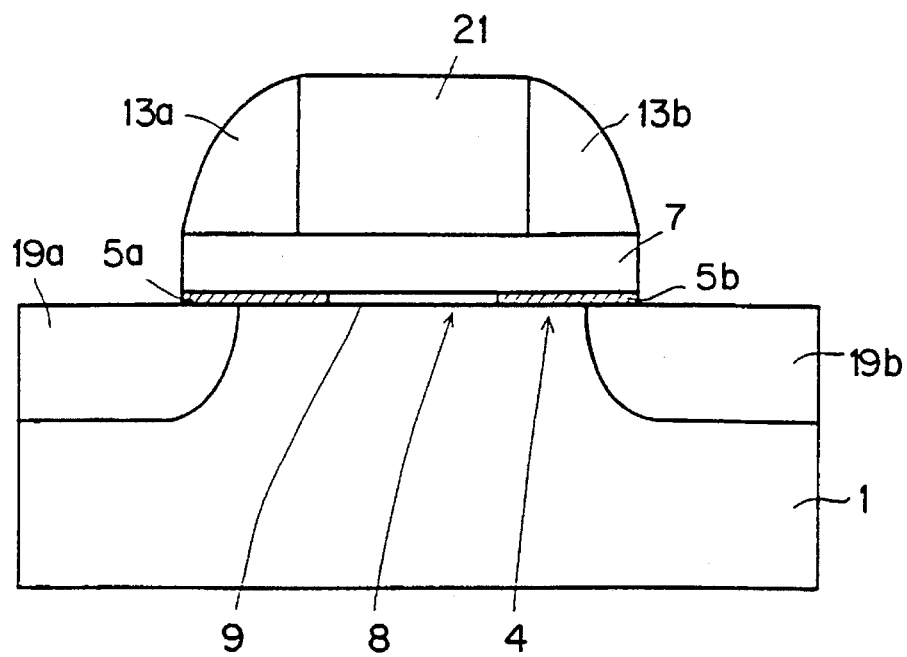
FIG. 63 is a schematic cross-sectional view of a fourteenth embodiment of a field effect transistor in accordance with the present invention.

FIG. 63 is a schematic cross-sectional view of a fourteenth embodiment of a field effect transistor according to the present invention. The same constituent members as those of the field effect transistor shown in FIG. 25 are denoted with the same reference numerals. In this embodiment, since the thickness of gate electrode 7 is thin, an anti-nitridation mask 21 is formed on a silicon oxide film 9 so as not to diffuse nitrogen down to silicon oxide film 9. As anti-nitridation mask 21, a silicon oxide film, a silicon nitride film or the like may be used.

A method of manufacturing the field effect transistor of the fourteenth embodiment according to the present invention is similar to the manufacturing method of the thirteenth embodiment. That is, with reference to FIG. 59, polycrystalline silicon to be gate electrode 7 is formed on silicon oxide film 9, thereby forming an anti-nitridation mask on the polycrystalline silicon. Only the anti-nitridation mask is then patterned by using photolithography and etching technology, as shown in FIG. 59. Subsequent processing steps are the same as those in the thirteenth embodiment.

A fifteenth embodiment

Figure 64:
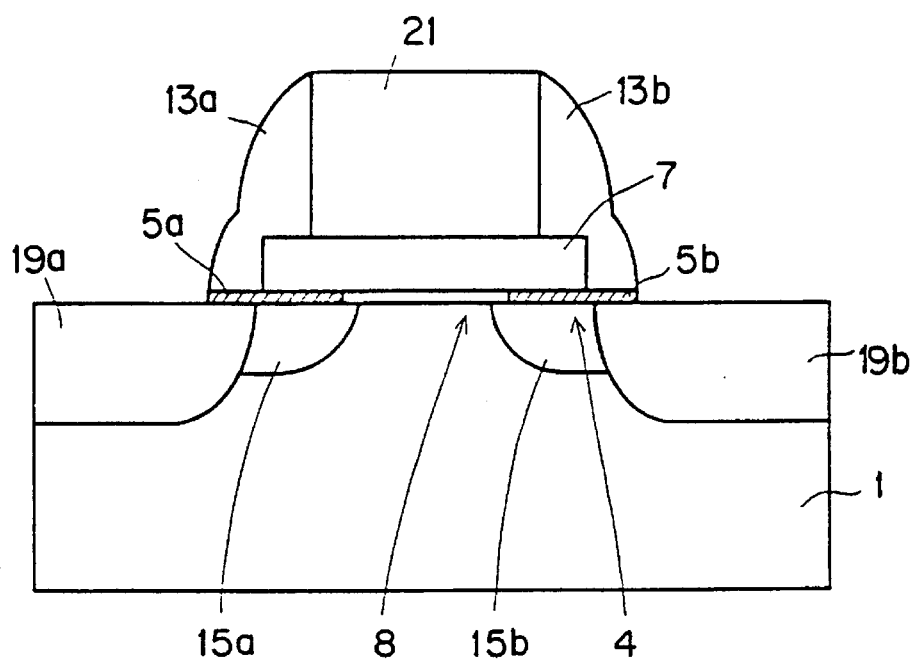
FIG. 64 is a schematic cross-sectional view of a fifteenth embodiment of a field effect transistor in accordance with the present invention.
Figure 65:
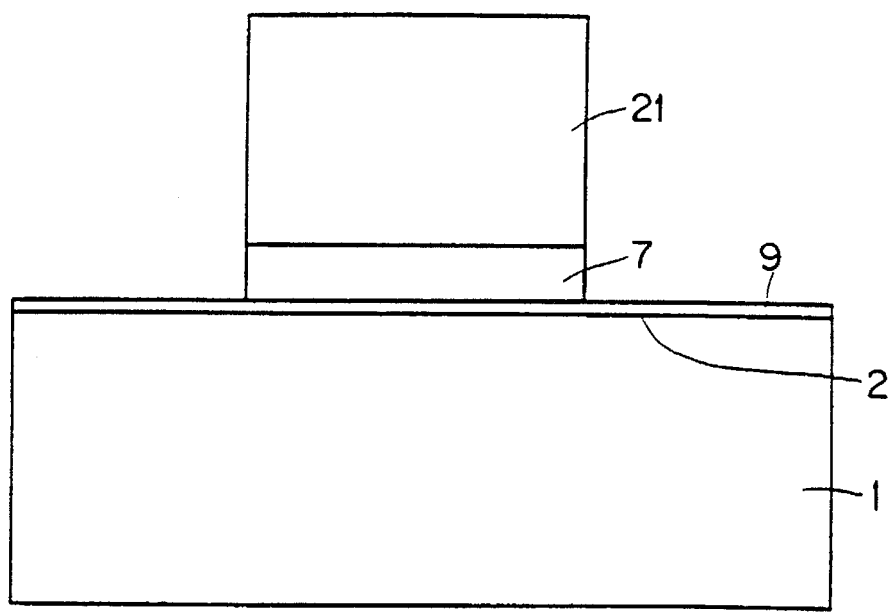
FIGS. 65–67 are cross-sectional views showing, respectively, first, second and third steps of a manufacturing method of the fifteenth embodiment of the field effect transistor according to the present invention.

FIG. 64 is a schematic cross-sectional view of a field effect transistor of a fifteenth embodiment according to the present invention. The same constituent members as those of the field effect transistor shown in FIG. 25 are denoted with the same reference numerals. A description will now be made on a method of manufacturing the field effect transistor of the fifteenth embodiment in accordance with the present invention. As shown in FIG. 65, polycrystalline silicon, an anti-nitridation mask 21 to be a silicon oxide film 9 and a gate electrode 7 are formed in turn on a main surface 2 of silicon substrate 1. By employing photolithography and etching technology, anti-nitridation mask 21 and polycrystalline silicon are patterned to form a resultant film shown in FIG. 65. Anti-nitridation mask 21 may be a conductive substance or insulating substance.

Figure 66:
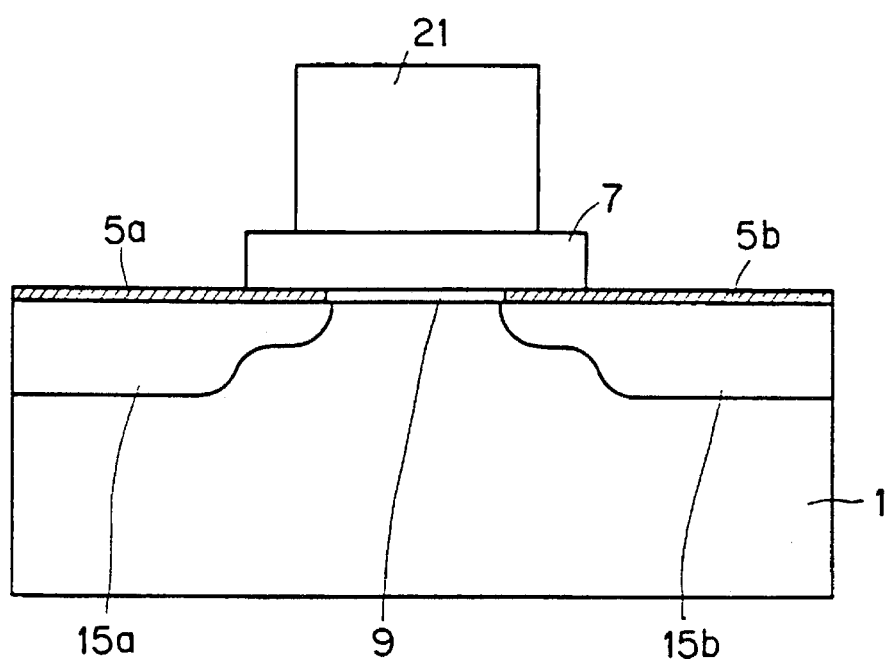

Referring to FIG. 66, only anti-nitridation mask 21 is subjected to isotropic etching. In isotropic etching, a side surface of anti-nitridation mask 21 is also etched. Thus, a side portion of gate electrode 7 is exposed. Nitridation and re-oxidation are carried out with anti-nitridation mask 21 used as a mask, thereby forming nitrided oxide films 5a and 5b. Since anti-nitridation mask 21 is thick, nitrogen entering into anti-nitridation mask 21 is distributed. Thus, no nitrided layer is formed in anti-nitridation mask 21. With anti-nitridation mask 21 used as a mask, silicon substrate 1 is ion-implanted, to form a low concentration source region 15a and a low concentration drain region 15b.

Figure 67:
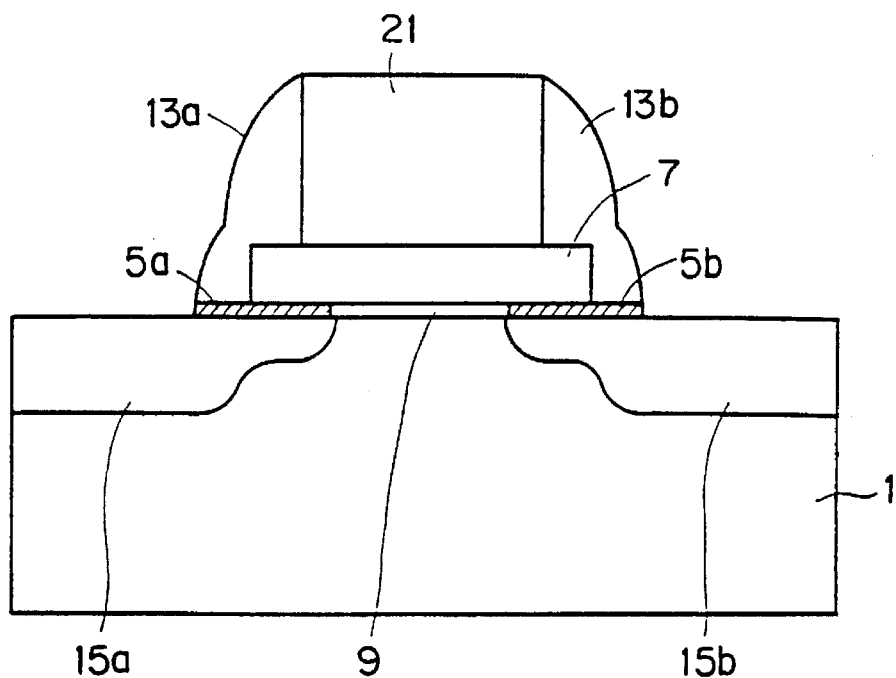

As shown in FIG. 67, a silicon oxide film is formed over the entire main surface 2 of silicon substrate 1 and then subjected to anisotropic etching, thereby forming sidewall insulator films 13a and 13b. As shown in FIG. 64, with anti-nitridation mask 21 and sidewall insulator films 13a and 13b used as masks, silicon substrate 1 is ion-implanted to form a high concentration source region 19a and a high concentration drain region 19b.

A sixteenth embodiment

Figure 68:
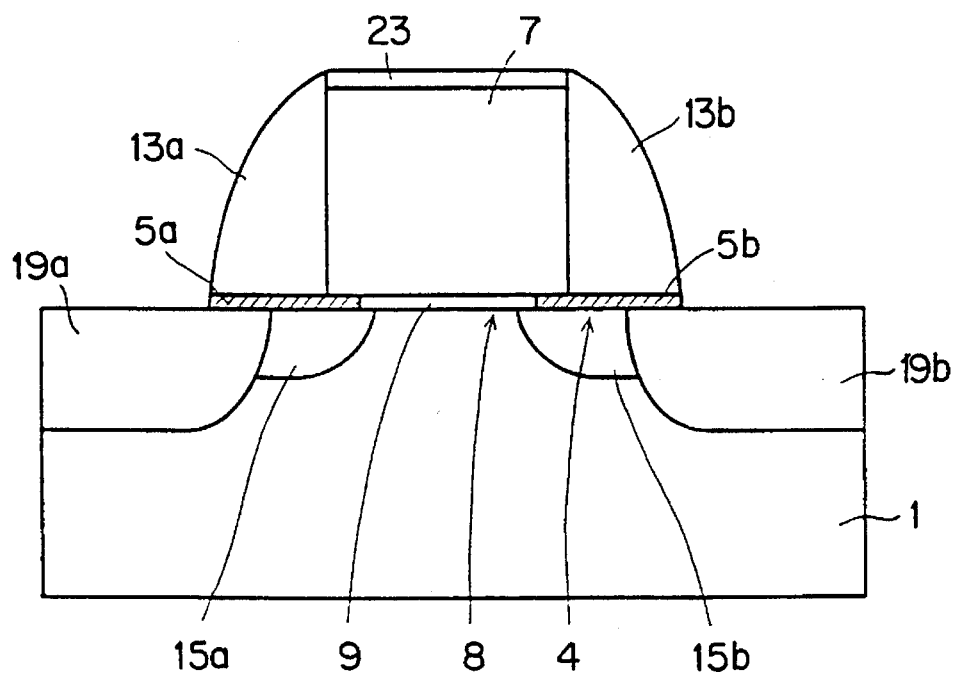
FIG. 68 is a schematic cross-sectional view of a sixteenth embodiment of a field effect transistor in accordance with the present invention.

FIG. 68 is a schematic cross-sectional view of a sixteenth embodiment of a field effect transistor according to the present invention. The same constituent members as those of the field effect transistor shown in FIG. 25 are denoted with the same reference numerals. Although the eleventh embodiment shown in FIG. 56 is of a single drain structure, the sixteenth embodiment is of an LDD structure. An etching stopper denoted with a reference numeral 23 plays the same role as etching stopper 23 shown in FIG. 56.

A seventeenth embodiment

Figure 69:
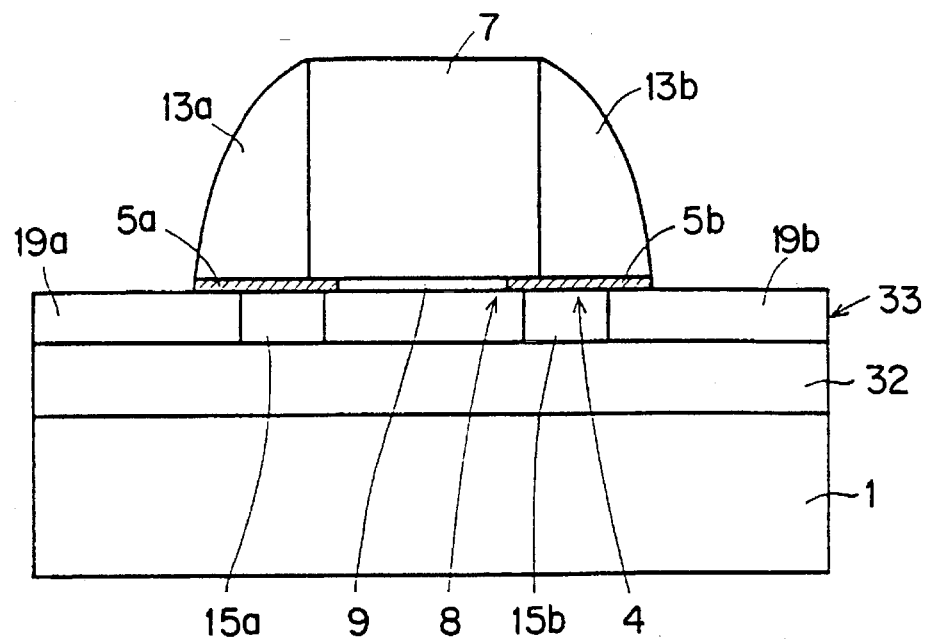
FIG. 69 is a schematic cross-sectional view of a seventeenth embodiment of a field effect transistor in accordance with the present invention.

FIG. 69 is a schematic cross-sectional view of a seventeenth embodiment of a field effect transistor according to the present invention. A silicon oxide film 32 being one example of an insulator film is formed on a main surface of a silicon substrate 1. A monocrystalline or polycrystalline silicon film 33 is formed on silicon oxide film 32. A high concentration source region 19a, a low concentration source region 15a, a low concentration drain region 15b and a high concentration drain region 19b are formed in silicon film 33. A drain avalanche hot carrier injection region is denoted with a reference numeral 4. A channel hot hole (electron) injection region is denoted with a reference numeral 8. The present invention is also applicable to a field effect transistor formed on silicon oxide film 32 serving as an insulator layer.

An eighteenth embodiment

Figure 70:
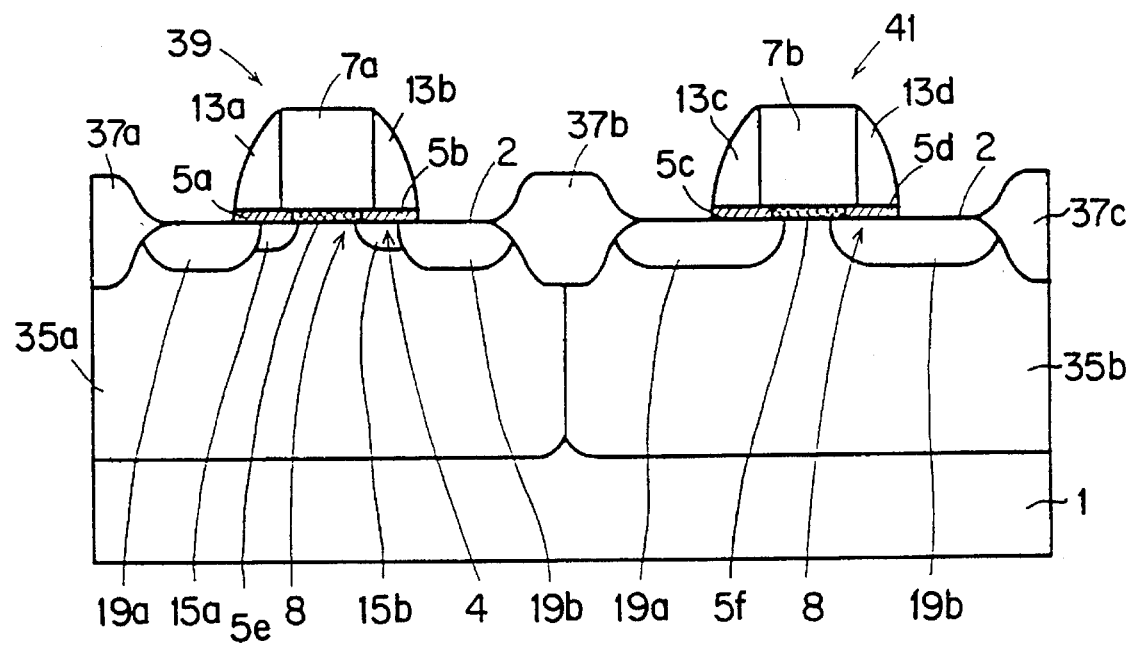
FIG. 70 is a schematic cross-sectional view of an eighteenth embodiment of a field effect transistor in accordance with the present invention.
Figure 71:
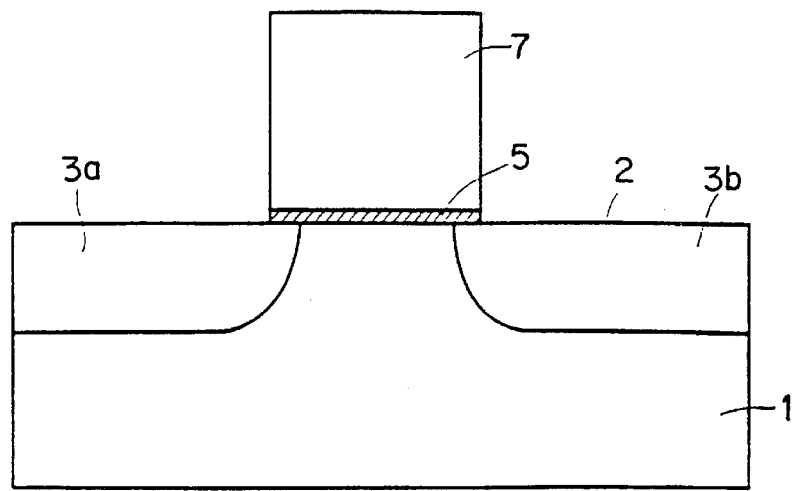
FIG. 71 is a schematic cross-sectional view of a conventional field effect transistor.
Figure 72:
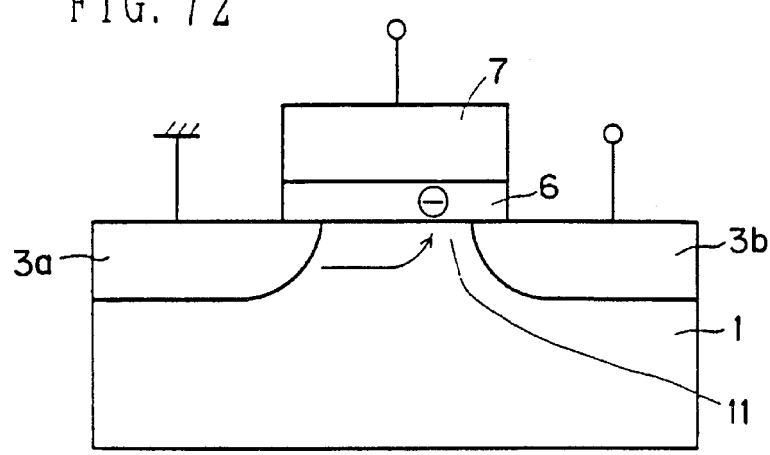
FIG. 72 is a cross-sectional view of a field effect transistor for use in explaining channel hot electrons.
Figure 73:
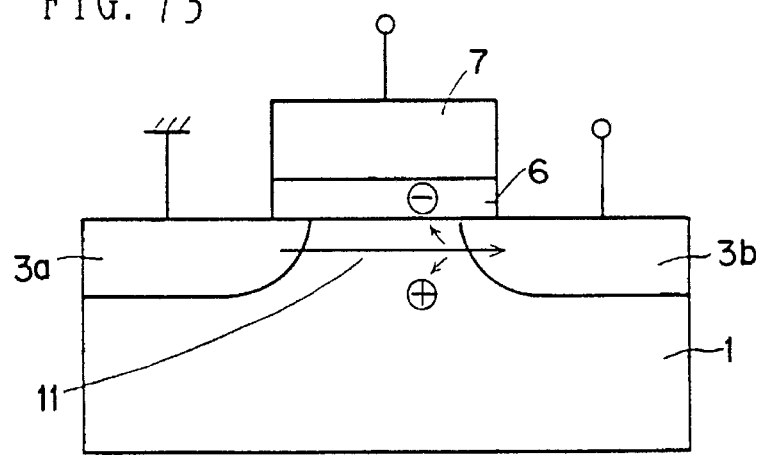
FIG. 73 is a cross-sectional view of a field effect transistor for use in explaining drain avalanche hot carriers.
Figure 74:
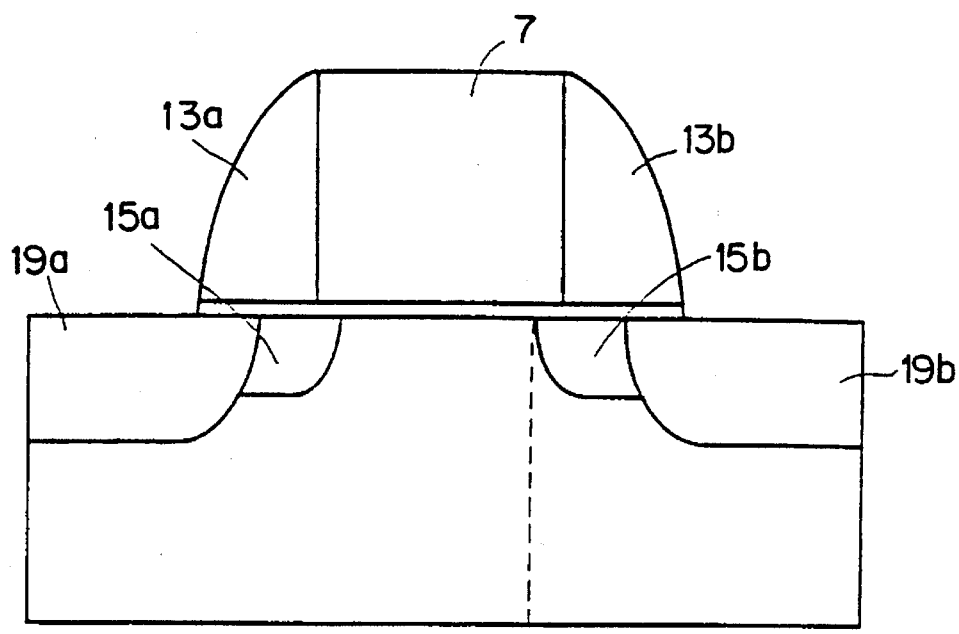
FIG. 74 is a diagram showing the relationship between concentration of a low concentration drain region and the amount of injected hot carriers.
Figure 74:
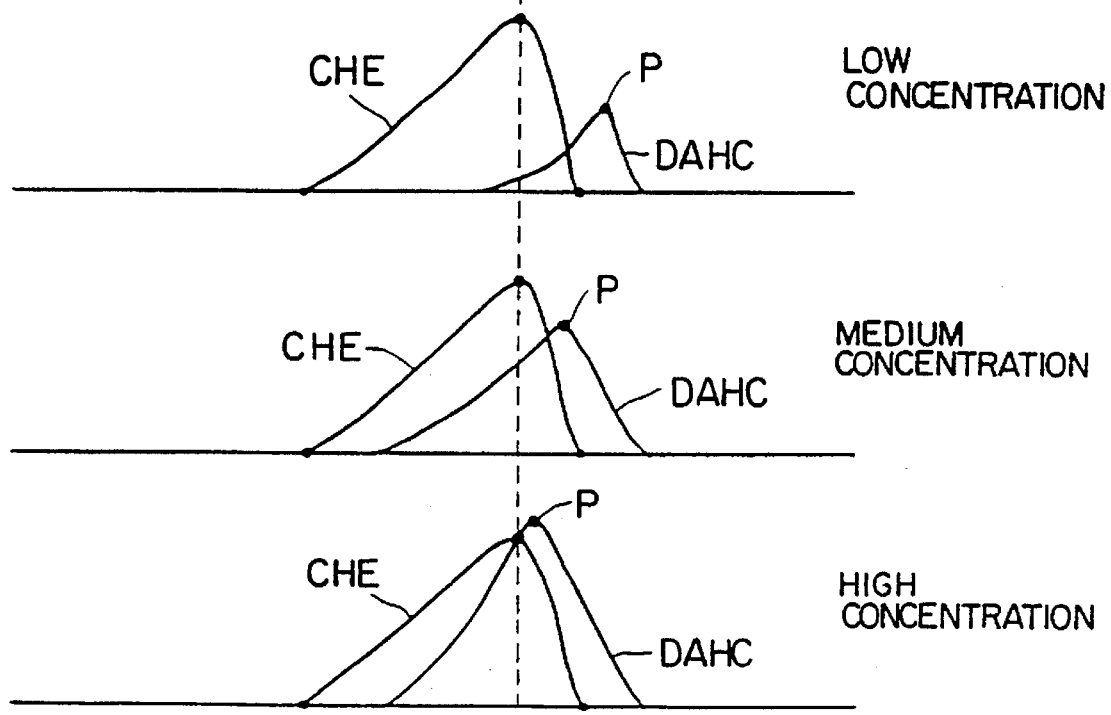

FIG. 70 is a schematic cross-sectional view of an eighteenth embodiment of a field effect transistor according to the present invention. In the eighteenth embodiment, the present invention is applied to a CMOS. An NMOS field effect transistor 39 and a PMOS field effect transistor 41 are formed in a silicon substrate 1. A P type well and an N type well are denoted with reference characters 35a and 35b, respectively.

A high concentration source region 19a and a high concentration drain region 19b are formed with a spacing from each other in P type well 35a. A low concentration source region 15a and a low concentration drain region 15b are formed with a spacing from each other between high concentration source and drain regions 19a and 19b. A nitrided oxide film 5b is formed on a drain avalanche hot carrier injection region 4. A nitrided oxide film 5e is formed on a channel hot electron injection region 8. Reference characters 5a and 7a denote a nitrided oxide film and a gate electrode, respectively. Sidewall insulator films are denoted with reference characters 13a and 13b. A nitrogen concentration in nitrided oxide films 5a and 5b is higher than that in nitrided oxide film 5e.

High concentration source and drain regions 19a and 19b are formed with a spacing from each other in N type well 35b. A nitrided oxide film 5f is formed on channel hot hole injection region 8. Reference characters 5c and 5d denote nitrided oxide films. In the PMOS transistor, since the same resistivity to drain avalanche hot carriers is provided for any films as shown in FIG. 76, no consideration has been taken for a film formed on the drain avalanche hot carrier injection region. A nitrogen concentration in nitrided oxide films 5c and 5d is higher than that in nitrided oxide film 5f. A reference character 7b denotes a gate electrode. Reference characters 13c and 13d denote sidewall insulator films.

Reference characters 37a, 37b and 37c denote field oxide films.

The reason why PMOS field effect transistor 41 does not have an LDD structure is that since the PMOS field effect transistor has a large thermal diffusion coefficient of ions for use in formation of an impurity region, the transistor cannot easily be of the LDD structure. Also, since the PMOS field effect transistor has a higher hot carrier resistivity even with a single drain structure, there is no need for the transistor to be of the LDD structure.

When nitrided oxide film 5e is employed as a gate insulator film, a current handling capability at a low gate voltage becomes lower and that at a high gate voltage becomes higher in NMOS field effect transistor 39 as compared to the case where a silicon oxide film is employed as the gate insulator film. Further, the resistivity to drain avalanche hot carriers improves, whereas the resistivity to channel hot electrons deteriorates. The decrease in current handling capability at a low gate voltage and the deterioration in channel hot electron resistivity can be overcome by reducing nitridation in the formation of nitrided oxide film 5e as has been described in the sixth embodiment.

In a PMOS transistor using nitrided oxide film 5f as the gate insulator film, the current handling capability decreases at any gate voltage as compared to the case where a silicon oxide film is employed as the gate insulator film. The resistivity to drain avalanche hot carriers is identical or slightly decreased. Further, the resistivity to channel hot holes deteriorates. However, it appears that the above disadvantages can be overcome by reducing nitridation in the formation of nitrided oxide film 5f.

According to a first aspect of the present invention, an oxide film 9 having a channel hot carrier resistivity is formed on a channel hot carrier injection region 8. Thus, a field effect transistor having a higher hot carrier resistivity at a high gate voltage can be structured even if including a nitrided oxide film 5 therein. In addition, a nitrided oxide film 5 is formed on a drain avalanche hot carrier injection region 4. Accordingly, a hot carrier resistivity at a low gate voltage can be at approximately the same level as that provided when a silicon oxide film is formed on the drain avalanche hot carrier injection region.

According to a second aspect of the present invention, a nitrided oxide film 5 in which a nitrogen concentration becomes higher from a source region 3a to a drain region 3b is formed over the drain avalanche hot carrier injection region 4 and the channel hot carrier injection region 8. This makes it possible to achieve the same effect as that provided in the first aspect of the present invention.

According to a third aspect of the present invention, it is possible to manufacture a structure provided in the case where a nitrogen concentration in an oxide film 9 is zero in the first aspect of the present invention.

According to a fourth aspect of the present invention, it is possible to manufacture a structure provided in the case where a nitrogen concentration in an oxide film is zero in the first aspect of the present invention. Further, a silicon oxide film damaged by etching which is formed on the drain avalanche hot carrier injection region 4 is removed, and a new nitrided oxide film 56 is formed on the drain avalanche hot carrier injection region 4. Accordingly, a nitrided oxide film with a lower interface state can be obtained.

According to a fifth aspect of the present invention, it is possible to manufacture a field effect transistor having two types of nitrided oxide films 5, 5b of different nitrogen concentrations.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A field effect transistor for controlling a flow of carriers by a voltage applied to a gate electrode, said field effect transistor comprising:

a semiconductor substrate having a main surface;

a source region and a drain region formed with a spacing from each other in said semiconductor substrate;

an insulating film formed on said main surface located between said source region and said drain region;

a gate electrode formed on said insulating film; and sidewall films including a nitrided oxide film to interpose said gate electrode therebetween.

2. A field effect transistor, comprising:

a semiconductor substrate having a major surface;

source and drain regions spaced apart from each other in the major surface of said substrate and defining a channel region therebetween;

a gate insulating film overlying at least the channel region on the major surface of said substrate; and a gate electrode on said gate insulating film;

wherein said gate insulating film comprises, respectively, a first discrete region of a nitrided oxide and a second discrete region of silicon oxide adjacent the first discrete region along a channel in a direction which extends between said source and drain regions, wherein the second discrete region of silicon oxide has a nitrogen concentration equal to zero or lower than a nitrogen concentration in the first discrete nitrided oxide region.

3. The field effect transistor of claim 2, wherein said second region of nitrided oxide is closer than said first region of silicon oxide to said drain region.

4. The field effect transistor of claim 2, wherein said drain region comprises adjoining high concentration and low concentration regions, with said low concentration region being closer than said high concentration region to said channel region, and wherein said second region of nitrided oxide of said gate insulating film overlies an interface between said high and low concentration regions in said substrate.

5. The field effect transistor of claim 4, wherein said first silicon oxide region overlies the channel region in said substrate.

6. The field effect transistor of claim 5, wherein said first silicon oxide region extends slightly outside the channel region to overlie a portion of the low concentration region in said substrate.

7. The field effect transistor of claim 2, wherein a sidewall insulating film is provided to interpose said gate electrode, and said gate insulating film extends beneath said sidewall insulating film.

* * * * *